(12) United States Patent
Andrews et al.

(10) Patent No.: US 8,308,886 B2
(45) Date of Patent: Nov. 13, 2012

(54) DONOR ELEMENTS AND PROCESSES FOR THERMAL TRANSFER OF NANOPARTICLE LAYERS

(75) Inventors: Gerald Donald Andrews, Hockessin, DE (US); Marc B Goldfinger, West Chester, PA (US); Mark Andrew Harmer, Landenberg, PA (US); Gary Delmar Jaycox, West Chester, PA (US); Lynda Kaye Johnson, Wilmington, DE (US); Irina Malajovich, Swarthmore, PA (US); William J Marshall, Wilmington, DE (US); Elizabeth Forrester McCord, Hockessin, DE (US); Charles Nehemiah McEwen, Newark, DE (US); Jeffrey Scott Meth, Landenberg, PA (US); Richard Kevin Bailey, Newark, DE (US); Geoffrey Nunes, Swarthmore, PA (US); Rinaldo Soria Schiffino, Wilmington, DE (US); Paul J Shannon, Exton, PA (US); Kenneth George Sharp, Landenberg, PA (US); Karyn B Visscher, Morris Plains, NJ (US); Graciela Beatriz Blanchet, Boston, MA (US); John W Catron, Jr., Smyrna, DE (US); Reid John Chesterfield, Wilmington, DE (US); Thomas C Felder, Kennett Square, PA (US); Feng Gao, Hockessin, DE (US); Howard David Glicksman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1633 days.

(21) Appl. No.: 11/488,262

(22) Filed: Jul. 17, 2006

(65) Prior Publication Data
US 2010/0239794 A1    Sep. 23, 2010

(51) Int. Cl.
B41M 5/40 (2006.01)
B32B 3/10 (2006.01)
H01L 29/78 (2006.01)
(52) U.S. Cl. .............. 156/235; 257/288; 257/E29.255; 428/32.72; 428/32.74; 428/32.77; 428/207
(58) Field of Classification Search ................ 156/235; 257/288, E29.255; 428/32.72, 32.74, 32.77, 428/207
See application file for complete search history.

(56) References Cited

U.S. PATENT DOCUMENTS
4,743,091 A    5/1988    Gelbart
(Continued)

FOREIGN PATENT DOCUMENTS
| EP | 1 541 556 | * | 6/2005 |
| WO | 94/21701 A1 | | 9/1994 |
| WO | 03/052841 A1 | | 6/2003 |
| WO | 03/099574 A1 | | 12/2003 |
| WO | 2005/004205 A2 | | 1/2005 |
| WO | 2006/004508 A1 | | 1/2006 |
| WO | 2006/024012 A1 | | 3/2006 |

OTHER PUBLICATIONS
International Search Report Dated Nov. 6, 2008 for International Application No. PCT/US07/016120.
(Continued)

*Primary Examiner* — Gerard Higgins
*Assistant Examiner* — Sathavaram I Reddy

(57) ABSTRACT
The invention discloses processes for thermal transfer patterning of a nanoparticle layer and a corresponding proximate portion of a carrier layer, and optionally additional transfer layers, together onto a thermal imaging receiver. The invention is useful for dry fabrication of electronic devices. Additional embodiments of the invention include multilayer thermal imaging donors comprising in layered sequence: a base film, a carrier layer and a nanoparticle layer. The carrier layer can be a dielectric or conducting layer. When the carrier layer is a dielectric layer, the base film includes a light attenuating agent in the form of a dye or pigment.

37 Claims, 8 Drawing Sheets

U.S. PATENT DOCUMENTS

| | | | | |
|---|---|---|---|---|
| 5,312,683 | A | * | 5/1994 | Chou et al. ............... 428/32.74 |
| 5,370,825 | A | | 12/1994 | Angelopoulos et al. |
| 5,413,839 | A | * | 5/1995 | Chatwin et al. ............. 428/32.6 |
| 5,468,564 | A | * | 11/1995 | Ohtani et al. ............... 428/32.6 |
| 5,534,387 | A | | 7/1996 | Bodager et al. |
| 5,565,301 | A | | 10/1996 | Bodager |
| 5,726,524 | A | | 3/1998 | Debe |
| 5,863,465 | A | | 1/1999 | Kinlen |
| 5,977,263 | A | * | 11/1999 | Phillips .................... 525/329.9 |
| 6,083,872 | A | * | 7/2000 | Adkins ........................ 503/227 |
| 6,228,555 | B1 | * | 5/2001 | Hoffend et al. ............. 430/200 |
| 6,521,324 | B1 | | 2/2003 | Debe et al. |
| 6,645,681 | B2 | * | 11/2003 | Andrews et al. ................ 430/7 |
| 2003/0235768 | A1 | * | 12/2003 | Fincher et al. .................. 430/7 |
| 2004/0021131 | A1 | * | 2/2004 | Blanchet-Fincher et al. 252/500 |
| 2005/0029934 | A1 | * | 2/2005 | Blanchet-Fincher ......... 313/504 |
| 2005/0082523 | A1 | | 4/2005 | Blanchet-Fincher et al. |
| 2005/0116202 | A1 | | 6/2005 | Gao et al. |
| 2005/0189883 | A1 | | 9/2005 | Suh et al. |

OTHER PUBLICATIONS

MacDiarmid, "Synthetic Metals": A Novel Role for Organic Polymers, Nobel Prize 2000 Lecture, Current Applied Physics, 2001, p. 269-279, vol. 1.

MacDiarmid, "Synthetic Metals": A Novel Role for Organic Polymers (Nobel Lecture), Angew. Chem. Int. Ed., 2001, p. 2581-2590, vol. 40.

Heeger, Semiconducting and Metallic Polymers: The Fourth Generation of Polymeric Materials (Nobel Lecture), Angew. Chem. Int. Ed., 2001, p. 2591-2611, vol. 40.

O'Brien et al., Synthesis of Monodisperse Nanoparticles of Barium Titanate: Toward A Generalized Strategy of Oxide Nanoparticle Synthesis, J. Am. Chem. Soc., 2001, pp. 12085-12086, vol. 123.

"Nanoparticles: From Theory to Application", 2004, G. Schmid, Wiley-VCH, Weinheim (Book Not Included).

"Nanoscale Materials in Chemistry", 2001, K. J. Klabunde, Wiley-Interscience, New York (Book Not Included).

"Infrared Absorbing Materials" M. Matsuoka, 1990, Plenium Press, New York (Book Not Included).

"Absorption Spectra of Dyes for Diode Lasers", M. Matsuoka, 1990, Bunshin Publishing Co., Tokyo (Book Not Included).

"Handbook of Conducting Polymers", T. Skotheim, 1986, Chapter 25, vol. 2, Marcel Dekker, Inc., New York (Book Not Included).

"Handbook of Conducting Polymers", T. Skotheim, R. Elsenbaumer, and J. Reynolds, 2nd Edition, 1998, Marcel Dekker, Inc., New York (Book Not Included).

"Handbook of Plasticizers" G. Wypych, 2004, Chemtec Publishing, Toronto, Ont. (Book Not Included).

* cited by examiner

DONOR ELEMENTS AND PROCESSES FOR THERMAL TRANSFER OF NANOPARTICLE LAYERS

This invention was made with United States Government support under Agreement No. 70NANB2H03032 awarded by NIST Advanced Technology Program. The United States Government has certain rights in the invention.

FIELD OF INVENTION

The invention relates to processes for thermal transfer of a to nanoparticle layer onto a substrate. More specifically, the invention relates to single-step processes for the dry patterned deposition of a nanoparticle layer on a substrate.

BACKGROUND

A variety of electronic articles and devices utilize modified surfaces that have nanoparticle layers or nano-scale elements thereon. These articles and devices are made through deposition and patterning of nanoparticles on suitable substrates. These are typically deposited from a liquid or a vapor phase.

Laser-induced thermal transfer processes typically use a donor element, including a layer of material to be transferred, referred to herein as a transfer layer, and a receiver element, including a surface for receiving the transferred material. Either the substrate of the donor element or the receiver element is transparent, or both are transparent. The donor element and receiver element are brought into close proximity or into contact with each other and selectively exposed to laser radiation, usually by an infrared laser. Heat is generated in the exposed portions of the transfer layer, causing the transfer of those portions of the transfer layer onto the surface of the receiver element. If the material of the transfer layer does not absorb the incoming laser radiation, the donor element should include a heating layer, also known as a light-to-heat conversion (LTHC) layer or a transfer-assist layer, in addition to the transfer layer.

In a typical laser-induced digital thermal transfer process the exposure takes place only in a small, selected region of the assembly at a time, so that transfer of material from the donor element to the receiver element can be built up one region at a time. The region may be a pixel, some portion of a pixel or a number of pixels. Computer control facilitates the transfer at high speed and high resolution. Alternatively, in an analog process, the entire assembly is irradiated and a mask is used to selectively expose desired portions of the thermally imagable layer.

U.S. Pat. No. 6,521,324 discloses articles formed by thermal transfer of a microstructured layer having surface-defining microstructured features, as well as the thermal transfer elements and methods for making the articles. The details of the vapor deposition and annealing used in the '324 patent are disclosed further in U.S. Pat. No. 5,726,524.

WO 2005/004205 discloses a method of forming a pattern of filled dielectric material on a substrate by a thermal transfer process comprising exposing to heat a thermally imagable donor element comprising a substrate and a transfer layer of dielectric material.

There is a need for a process that enables single-step deposition of substantially nanoparticle layers onto a substrate for electronic and optical applications. For instance, there is a need for high k printable dielectrics, wherein the dielectric particles make up the substantial wt % of the printable layer. Further, there is a need for a printing process that is dry and therefore does not involve solvent incompatibility issues.

SUMMARY OF INVENTION

One embodiment of the invention is a process for thermal transfer patterning of nanoparticles comprising the steps of: a) providing a thermal imaging donor comprising, in layered sequence: a base film, a carrier layer and a nanoparticle layer; b) contacting the thermal imaging donor with a thermal imaging receiver, wherein the thermal imaging receiver comprises a base film; and c) transferring at least a portion of the nanoparticle layer and a corresponding proximate portion of the carrier layer together onto the thermal imaging receiver by thermal transfer to provide, in layered sequence on said receiver, a patterned nanoparticle layer and a patterned carrier layer; wherein said thermal imaging donor is made by a process comprising providing a fluid dispersion consisting essentially of: (1) a non-volatile fraction containing a nanoparticle fraction at a loading of 65 to 100 wt %, and, optionally, a dispersant at a loading of up to 35 wt %, based on the weight of the non-volatile fraction; and (2) a volatile carrier fluid; and applying said fluid dispersion onto the carrier layer and volatilizing the carrier fluid to provide said thermal imaging donor.

Another embodiment of the invention is a multilayer thermal imaging donor comprising, in layered sequence: (a) a base film; (b) a carrier layer selected from the group consisting of: a dielectric layer and a conducting layer; (c) a nanoparticle layer comprising a nanoparticle fraction comprising a plurality of nanoparticles characterized by an average longest dimension of about 5 nm to about 1500 nm; wherein, if the carrier layer comprises a dielectric layer, the base film comprises a first light attenuating agent and has an OD of 0.1 or greater at a wavelength in the range of about 350 nm to about 1500 nm.

A further aspect of the invention is a composition comprising a thermal imaging receiver comprising a base film, a patterned nanoparticle layer and a patterned carrier layer, produced by: a) providing a thermal imaging donor comprising, in layered sequence: a base film, a carrier layer and a nanoparticle layer; b) contacting the thermal imaging donor with a thermal imaging receiver, wherein the thermal imaging receiver comprises a base film; and c) transferring at least a portion of the nanoparticle layer and a corresponding proximate portion of the carrier layer together onto the thermal imaging receiver by thermal transfer to provide, in layered sequence on said receiver, a patterned nanoparticle layer and a patterned carrier layer; wherein said thermal imaging donor is made by a process comprising providing a fluid dispersion consisting essentially of: (1) a non-volatile fraction containing a nanoparticle fraction at a loading of 65 to 100 wt %, and, optionally, a dispersant at a loading of up to 35 wt %, based on the weight of the non-volatile fraction; and (2) a volatile carrier fluid; and applying said fluid dispersion onto the carrier layer and volatilizing the carrier fluid to provide said thermal imaging donor.

DETAILED DESCRIPTION OF INVENTION

Figure 1A:
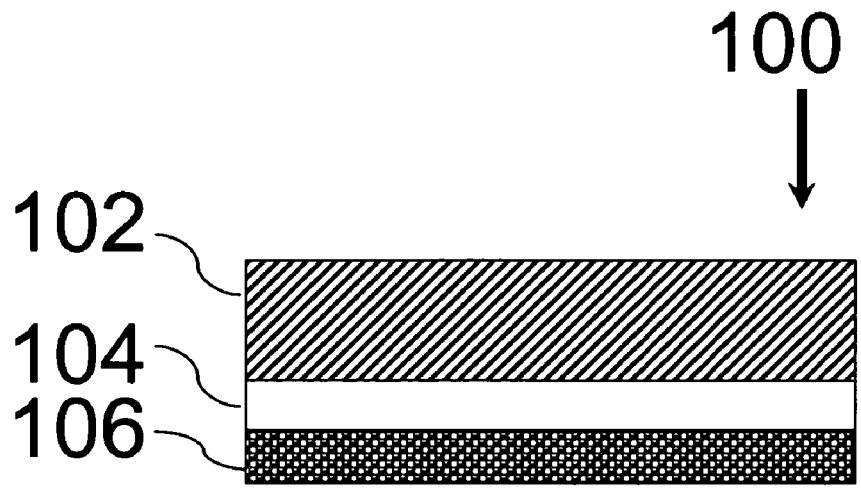
FIGS. 1A, 1B, and 1C are cross-sectional views of various thermal imaging donors, in accordance with different embodiments of the invention.

One embodiment of the invention is a process for the thermal transfer patterning of nanoparticles comprising transferring at least a portion of the nanoparticle layer and corresponding proximate portion of the carrier layer together onto a thermal imaging receiver in a thermal transfer step. The thermal imaging donor is prepared from a thermal imaging substrate comprising a base film and carrier layer, by applying a fluid dispersion of nanoparticles to the free surface of the carrier layer. In different embodiments of the invention the thermal imaging donor can include a base film, an optional LTHC layer, a carrier layer and a nanoparticle layer, applied consecutively as listed. The free surface of the donor is the surface residing on the last layer in any given sequence opposite the base film bottom layer. This free surface is used in applying additional layers to construct modified donors and ultimately is used in contacting the donor with a thermal imaging receiver. The carrier layer, and other layers including the base film, may comprise one or more layers. The thermal imaging donor may optionally include other layers known in the art, for example, an antistatic layer may be present adjacent the base film and opposite the transfer layer; an interlayer may be disposed between the LTHC layer and the carrier layer; a primer layer, ejection layer, and/or an underlayer may be disposed between the base film and the LTHC layer; and an adhesive layer may be disposed adjacent the transfer layer opposite the base film. Thus, one or more other conventional thermal transfer donor element layers can be included in the thermal imaging substrate useful in the present invention, including but not limited to an interlayer, primer layer, release layer, ejection layer, thermal insulating layer, underlayer, adhesive layer, humectant layer, and light attenuating layer.

Herein the terms "acrylic", "acrylic resin", "(meth)acrylic resins", and "acrylic polymers", are synonymous unless specifically defined otherwise. These terms refer to the general class of addition polymers derived from the conventional polymerization of ethylenically unsaturated monomers derived from methacrylic and acrylic acids and alkyl and substituted-alkyl esters thereof. The terms encompass homopolymers and copolymers. The terms encompass specifically the homopolymers and copolymers of methyl (meth) acrylate, ethyl (meth)acrylate, butyl (meth)acrylate, 2-hydroxyethyl (meth)acrylate, (meth)acrylic acid and glycidyl (meth)acrylate. The term copolymer herein encompasses polymers derived from polymerization of two or more monomers and includes graft copolymers, unless specifically defined otherwise. The term (meth)acrylic acid encompasses both methacrylic acid and acrylic acid. The term (meth)acrylate, encompasses methacrylate and acrylate. The terms "styrene acrylic polymers", "acrylic styrene" and "styrene acrylic" are synonymous and encompass copolymers of the above described "acrylic resins" with styrene and substituted styrene monomers, for instance alpha-methyl styrene. The term "thermal transfer layer" encompasses nanoparticle layers, carrier layers and additional transfer layers and is a layer that undergoes transfer from a thermal transfer donor to a thermal transfer receiver in the process of thermal transfer patterning as herein disclosed.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

Nanoparticle and Nanoparticle Layer

The term "nanoparticle" or "nanoparticle layer" is meant to include nanoparticles, nanorods, nanowires, nanotubes, and nanostructures that are characterized by an average longest dimension of about 5 nm to about 1500 nm and preferably, about 5 nm to about 500 nm. Wherein the to particles are generally of spherical shape, the nanoparticles preferably have an average particle size of about 5 to about 1500 nm, and more preferably, about 5 to 500 nm. Scientific references that provide an overview and specific details of "nanoparticles" include "*Nanoparticles: From Theory to Application*" G. Schmid, (Wiley-VCH, Weinheim, 2004) and "*Nanoscale Materials in Chemistry*" K. J. Klabunde, (Wiley-Interscience, New York, 2001), hereby incorporated by reference. These references provide an understanding of nanoparticle synthesis, behavior and applications. The nanoparticles can be organic particles, inorganic particles or a combination. For instance, the nanoparticles may have an inorganic core, and a surface coating of organic material, if so desired, that is physically adsorbed to the nanoparticles or chemically bonded. Methods for surface-coating inorganic nanoparticles are well known in the art. Many suppliers of nanoparticles use undisclosed or proprietary surface coatings that act as dispersing aids. Throughout the specification, all reference to wt % of nanoparticles is meant to include the undisclosed or proprietary coatings that the manufacturer may, or may not, add as a dispersant aid. For instance, a commercial silver nanopowder is considered nominally 100 wt % silver, though it may have present an undisclosed dispersant.

Nanoparticle layers useful in the invention can be electrically, magnetically, or optically functional layers and include semiconducting; resistive; dielectric; conducting; superconducting; light-producing, e.g., luminescing, light-emitting, fluorescing or phosphorescing; electron-producing; hole-producing; ferroelectric; piezoelectric; ferritic; electro-optical; magnetic; light absorbing, reflecting, diffracting, scattering, dispersing, refracting, or diffusing; and refractive index modifying layers. Nanoparticles useful in forming conducting nanoparticle layers include conducting particles such as: carbon black, carbon nanotubes and metal-coated carbon nanotubes; metal particles such as: gold, silver, copper, iron, nickel, cobalt, platinum, palladium, chromium, molybdenum, tungsten, tantalum, tin, indium, lanthanum, gadolinium, ruthenium, titanium, yttrium, europium, gallium, zinc, magnesium, barium, cerium, strontium, lead, and antimony; doped and undoped metal oxide particles including transparent conductive oxides such as indium-tin-oxide (ITO), antimony-tin-oxide (ATO), tin oxide, fluorine-doped tin oxide, zinc oxide, aluminum-doped zinc oxide (AZO), and zinc tin oxide (ZTO); alloys thereof, composites thereof and core-shell structures thereof. Preferred conducting nanoparticles are selected from the group consisting of: gold, silver, copper, and alloys thereof; ITO, ATO, and carbon nanotubes. More preferred are silver nanoparticles with an average longest dimension of about 5 nm to about 1500 nm, and most preferred are silver nanoparticles with an average particle size of about 200 nm to about 400 nm.

Nanoparticles useful in forming semiconducting nanoparticle layers include: silicon; germanium; III-V semiconductor compounds such as gallium arsenide, alloys of gallium arsenide, gallium nitride and alloys of gallium nitride; and II-VI semiconductor compounds such as zinc oxide, cadmium selenide, and cadmium sulfide.

Nanoparticles useful in forming dielectric nanoparticle layers include dielectric particles such as: silicon dioxide, silicon nitride, alumina, titanates, zirconates, niobates, stannates, other mixed metal oxides, $TiO_2$, $Ta_2O_5$, $SrTiO_3$, $BaTiO_3$, $CaTiO_3$, $PbTiO_3$, $CaZrO_3$, $BaZrO_3$, $CaSnO_3$, $BaSnO_3$, $Al_2O_3$, $ZrO_2$, $Bi_4Ti_3O_{12}$, $BaMgF_4$, $PbZr_xTi_{1-x}O_3$, $PbMg_{1/3}Nb_{2/3}O_3$, $Zr_{0.7}Sn_{0.3}TiO_4$, $Zr_{0.4}Sn_{0.66}Ti_{0.94}O_4$, $CaZr_{0.98}Ti_{0.02}O_3$, $SrZr_{0.94}Ti_{0.06}O_3$, $BaNd_2Ti_5O_{14}$, $Pb_2Ta_2O_7$, barium zirconium titanate, barium strontium titanate, barium neodymium titanate, lead magnesium niobate, lead zinc niobate, lead zirconate, cadmium niobate, other titanates and tantalates of strontium, lead, calcium, magnesium, zinc and neodymium, various other pyrochlores and other highly polar inorganic material. Preferred dielectric nanoparticles are selected from the group consisting of: barium titanate, strontium titanate, barium strontium titanate, silicon dioxide, aluminum oxide, and titanium dioxide.

Nanoparticles useful in forming light emitting nanoparticle layers include light emitting particles such as cadmium selenide, cadmium sulfide, lead selenide, lead sulfide, zinc sulfide, and indium phosphide.

Nanoparticles useful in forming resistive layers include Pd/Ag; metal rutile, pyrochlore, and perovskite phases including $RuO_2$, $Pb_2Ru_2O_{6-7}$, $SrRuO_3$; multi-component compounds of $Ru^{+4}$, $Ir^{+4}$ or a mixture of these (M"), said compound being expressed by the following general formula:

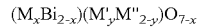
$(M_xBi_{2-x})(M'_yM''_{2-y})O_{7-x}$ wherein M is selected form the group consisting of yttrium, thallium, is indium, cadmium, lead, copper and rare earth metals; M' is selected from the group consisting of platinum, titanium, chromium, rhodium and antimony; M" is ruthenium, iridium or a mixture thereof; x denotes 0 to 2 with a proviso that x< or =1 for monovalent copper; y denotes 0 to 0.5 with the proviso that when M' is rhodium or two or more of platinum, titanium, chromium, rhodium and antimony, y is 0 to 1; and z denotes 0 to 1 with a proviso that when M is divalent lead or cadmium, z is at least equal to about x/2. These ruthenium pyrochlore oxides are described in U.S. Pat. No. 3,583,931. Resistor compositions can also combine conductor nanoparticles with insulator nanoparticles. Preferred conductor nanoparticles include ruthenium-based metal oxides. Preferred insulator nanoparticles can include low-melting glasses such as glass or ceramic nanoparticles or precursors. The glass can be silica, a lead-based glass, lead borosilicate, lead aluminum borosilicate glass or a silver-based glass.

Nanoparticles useful in forming ferroelectric nanoparticle layers include $BaTiO_3$, $SrTiO_3$, $PbTiO_3$, $KNbO_3$, $SrBi_2Ta_2O_9$, $BaSrTiO_3$, and solid solution stoichiometric variations thereof.

Nanoparticles useful in forming piezoelectric nanoparticle layers include those ferroelectrics listed above, quartz, and AlN.

Nanoparticles useful in forming ferritic nanoparticle layers include $Y_3Fe_5O_{12}$, $Ba_2Zn_2Fe_{12}O_{10}$, hexagonal ferrites such as barium ferrite, spinal ferrites such as nickel zinc ferrites, manganese zinc ferrite, and $Fe_3O_4$.

Nanoparticles useful in forming electro-optical nanoparticle layers include $LiNbO_3$, $CdTe$, and $ZnS$.

Nanoparticles useful in forming superconducting nanoparticle layers include $YBa_2Cu_3O_{7-x}$(YBCO), $Tl_2CaBa_2Cu_3O_{12}$, BiSrCaCuO, and BaKBiO.

Nanoparticles useful in forming phosphorescent layers include SrS:Eu, SrS:Ce, ZnS:Ag, $Y_2O_2$:Eu, $Zn_2SiO_4$:Mn.

Nanoparticles useful in forming refractive index modifying nanoparticle layers include refractive index modifiers such as magnesium fluoride and strontium titanate.

Base Film

FIG. 1A is a cross-sectional view of a thermal imaging donor 100 in accordance with one embodiment of the invention. Thermal imaging donor 100 comprises base film 102, carrier layer 104, and nanoparticle layer 106 dispersed on the surface of carrier layer 104. Base film 102 provides support to the other layers of thermal imaging donor 100. Base film 102 comprises a flexible polymer film that is preferably transparent. A suitable thickness for base film 102 is about 25 μm to about 200 μm, although thicker or thinner support layers may be used. The base film may be stretched by standard processes known in the art for producing oriented films and one or more other layers, such as the LTHC layer, may be coated onto the base film prior to completion of the stretching process. Preferred thermal imaging donor films comprise a polymeric material selected from the group consisting of: polyethylene terephthalate (PET), polyethylene naphthalate (PEN), triacetyl cellulose and polyimide.

Light-attenuating Agent

A light-attenuating agent may be present in a discrete layer or incorporated in one of the other functional layers of the donor element, such as the base film, the LTHC layer or the transfer layer. In one embodiment, the base film comprises a small amount (typically 0.2% to 0.5% by weight of the base film) of a light-attenuating agent such as a dye which can assist in the focusing of the radiation source onto the radiation-absorber in the LTHC layer during the thermal imaging step, thereby improving the efficiency of the heat transfer. U.S. Pat. No. 6,645,681, incorporated herein by reference, describes this and other ways in which the base film may be modified to assist in the focusing of a laser radiation source in which the equipment comprises an imaging laser and a non-imaging laser wherein the non-imaging laser has a light detector that is in communication with the imaging laser. The wavelength ranges at which the imaging and non-imaging laser operate (typically in the range from about 350 nm to about 1500 nm) determine the wavelength ranges in which the absorber(s) and/or diffuser(s) are active and inactive. For example, if the non-imaging laser operates in about the 670 nm region and the imaging laser at 830 nm, it is preferred that the absorber and/or diffuser operate to absorb or diffuse light in the 670 nm region, rather than in the 830 nm region. Herein, the light attenuating agent preferably absorbs or diffuses light in the visible region, and in one embodiment absorbs around 670 nm. Suitable light-attenuating agents are well known in the art and include the commercially available Disperse Blue 60 and Solvent Green 28 dyes and carbon black. Preferably the amount of light-attenuating agent is sufficient to achieve an optical density (OD) of 0.1 or greater at some wavelength of about 400 to about 750 nm, more preferably about 0.3 to about 1.5.

Light-to-heat Conversion Layer (LTHC)

Figure 1B:
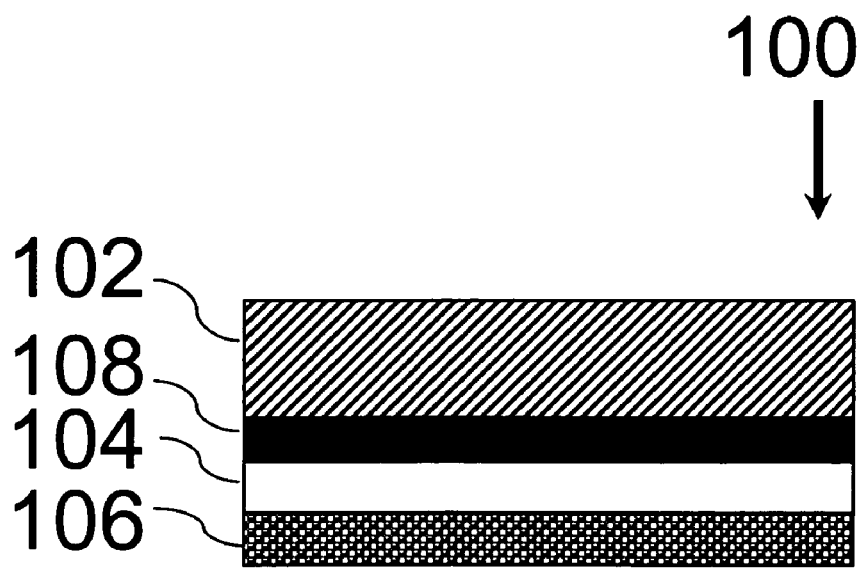

The thermal imaging donor may, optionally, have a light-to-heat-conversion layer (LTHC), interposed between the base film and the other layers as illustrated in FIG. 1B. Thermal imaging donor 100 comprises a LTHC layer 108 interposed between base film 102 and the carrier layer 104. LTHC layer 108 is incorporated as a part of thermal imaging donor 100 for radiation-induced thermal transfer to couple the energy of light radiated from a light-emitting source into the thermal transfer donor. Typically, the radiation absorber in the LTHC layer (or other layers) absorbs light in the infrared, visible, and/or ultraviolet regions of the electromagnetic spectrum and converts the absorbed light into heat. The radiation absorber is typically highly absorptive, providing an OD at the wavelength of the imaging radiation of 0.1 to 3 or higher and preferably 0.2 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metallized films, and other suitable absorbing materials.

Suitable radiation absorbers and binders for LTHC layers are well-known in the art and extensive lists and references can be found in PCT/US05/38010; PCT/US05/38009; U.S. Pat. No. 6,228,555 B1; Matsuoka, M., *"Infrared Absorbing Materials"*, Plenum Press, New York, 1990; and Matsuoka, M., *Absorption Spectra of Dyes for Diode Lasers*, Bunshin Publishing Co., Tokyo, 1990; which are herein incorporated by reference.

Preferred classes of near-infrared dyes for LTHC layers are cyanine compounds selected from the group consisting of: indocyanines, phthalocyanines including polysubstituted phthalocyanines and metal-containing phthalocyanines, and merocyanines. Sources of suitable infrared-absorbing dyes include H. W. Sands Corporation (Jupiter, Fla., US), American Cyanamid Co. (Wayne, N.J.), Cytec Industries (West Paterson, N.J.), Glendale Protective Technologies, Inc. (Lakeland, Fla.) and Hampford Research Inc. (Stratford, Conn.). Preferred dyes for LTHC, carrier layers and transfer layers are 3H-indolium, 2-[2-[2-chloro-3-[(1,3-dihydro-1,3, 3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1] and molecular weight of about 619 grams per mole, available from Hampford Research Inc, Stratford, Conn., as TIC-5c; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1], available from H. W. Sands Corp, as SDA 4927; and indolenine dyes SDA 2860 and SDA 4733 from H. W. Sands Corp. SDA 4927 is an especially preferred dye for the LTHC layer.

An LTHC layer may include a particulate radiation absorber in a binder. Examples of suitable pigments include carbon black and graphite.

The weight percent of the radiation absorber in the layer, excluding the solvent in the calculation of weight percent, is generally from 1 wt % to 85 wt %, preferably from 3 wt % to 60 wt %, and most preferably from 5 wt % to 40 wt %, depending on the particular radiation absorber(s) and binder(s) used in the LTHC layer.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, and styrene acrylics. The % transmittance of the LTHC layer is affected by the identity and amount of the radiation-absorber and the thickness of the LTHC layer. The LTHC layer should exhibit radiation transmission of about 20% to about 80%, more preferably of about 40% to about 50%, at the wavelength of the imaging radiation used in the thermal transfer imaging process. When a binder is present, the weight ratio of radiation absorber to binder is generally from about 5:1 to about 1:1000 by weight, preferably about 2:1 to about 1:100 by weight. A polymeric or organic LTHC layer is coated to a thickness of 0.05 μm to 20 μm, preferably, 0.05 μm to 10 and, more preferably, 0.10 μm to 5 μm.

In preferred embodiments of this invention, the LTHC layer may include a broad variety of water-soluble or water-dispersible polymeric binders with compositions as disclosed in the above referenced PCT/US05/38010 and PCT/US05/38009. Preferably, the average particle size of a water-dispersible binder in its aqueous phase is less than 0.1 micron, and more preferably less than 0.05 micron, and preferably having a narrow particle size distribution. Preferred water-soluble or water-dispersible polymeric binders for LTHC layers useful in the invention are those selected from the group: acrylic resins and hydrophilic polyesters and more preferably from sulphonated polyesters as described in the above referenced PCT/US05/38009.

Other preferred polymeric binders for LTHC layers are maleic anhydride polymers and copolymers including those comprising functionality provided by treating the maleic anhydride polymers and/or copolymers with alcohols, amines, and alkali metal hydroxides. Specific families of maleic anhydride based copolymers comprise the structure represented by formula (III)

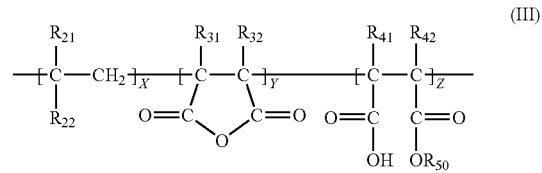

wherein x and z are any positive integer;
wherein y is zero or any positive integer;
$R_{21}$ and $R_{22}$ can be the same or different, and individually are hydrogen, alkyl, aryl, aralkyl, cycloalkyl, and halogen, provided that one of $R_{21}$ and $R_{22}$ is an aromatic group;
$R_{31}$, $R_{32}$, $R_{41}$ and $R_{42}$ are the same or different groups, which can be hydrogen or alkyl of one to about five carbon atoms; and
$R_{50}$ is functional group selected from:
    a) alkyl, aralkyl, alkyl-substituted aralkyl radicals containing from is one to about twenty carbon atoms;
    b) oxyalkylated derivatives of alkyl, aralkyl, alkyl-substituted aralkyl radicals containing from about two to about four carbon atoms in each oxyalkylene group, which can be of one to about twenty repeating units;
    c) oxyalkylated derivatives of alkyl, aralkyl, alkyl-substituted aralkyl radicals containing from about two to about four carbon atoms in each oxyalkylene group, which can be of one to about six repeating units;
    d) at least one unsaturated moiety;
    e) at least one heteroatom moiety;
    f) alkaline molecules capable of forming salts selected from Li, Na, K and $NH_4^+$; and
    g) combinations thereof.

A preferred maleic anhydride polymer for LTHC layers comprises a copolymer of formula (III), wherein $R_{21}$, $R_{31}$, $R_{32}$, $R_{33}$, $R_{41}$, $R_{42}$, $R_{43}$, are individually hydrogen, $R_{22}$ is phenyl, and $R_{50}$ is 2-(n-butoxy)ethyl. A specific example of a maleic anhydride copolymer useful in LTHC layers is a styrene maleic anhydride copolymer such as SMA 1440H, a product of Sartomer Corporation, Exton, Pa.

In one embodiment of the invention, a preferred LTHC layer comprises one or more water-soluble or water-dispersible radiation-absorbing cyanine compound(s) selected from the group consisting of: indocyanines, phthalocyanines including polysubstituted phthalocyanines and metal-containing phthalocyanines, and merocyanines; and one or more water-soluble or water-dispersible polymeric binders selected from the group consisting of: acrylic resins, hydrophilic polyesters, sulphonated polyesters, and maleic anhydride homopolymers and copolymers. A most preferred LTHC layer further comprises one or more release modifiers selected from the group consisting of: quaternary ammonium cationic compounds; phosphate anionic compounds; phosphonate anionic compounds; compounds comprising from one to five ester groups and from two to ten hydroxyl groups; alkoxylated amine compounds; and combinations thereof.

Metal radiation absorbers also may be used as LTHC layers, either in the form of particles or as films deposited by various techniques such as thermal evaporation, e-beam heating and sputtering, as disclosed in U.S. Pat. No. 5,256,506, hereby incorporated by reference. Nickel and chromium are preferred metals for the LTHC layer 108 with chromium being especially preferred. Any other suitable metal for the heating layer can be used. The preferred thickness of the metal heating layer depends on the optical absorption of the metals used. For chromium, nickel/vanadium alloy or nickel, a layer of 80-100 Angstroms is preferred.

Preferred radiation absorbers for LTHC layers utilized herein are selected from the group consisting of: metal films selected from Cr and Ni; carbon black; graphite; and near infrared dyes with an absorption maxima in the range of about 600 to 1200 nm within the LTHC layer.

Carrier Layer

The thermal imaging substrate comprises a base film and a carrier layer. The carrier layer thickness can be anywhere from about 5 nm to about 10 µm, preferably, about 100 nm to about 5 µm, and more preferably about 200 nm to about 3 µm.

The carrier layer 104 is made from a material that is capable of being thermally imaged or patterned and may comprise one or more layers. The carrier layer can act as a conducting, insulating, adhesive, planarizing or protective layer and is transferred along with the nanoparticle layer in the thermal transfer process. The carrier layer is typically an insulator or a conductor and may comprise any of a number of addition and condensation polymers and oligomers as described below.

A carrier or transfer layer comprising, for example, a π-conjugated polymer may be classified as a conductor or semiconductor layer depending on the nature of the other components in the layer. Likewise, a carrier or transfer layer comprising, for example, an insulating polymer may be classified as a conductor or dielectric layer depending on the nature of the other components in the layer. Herein a layer is classified as a semiconductor layer if it is possible to reversibly vary the layer's resistivity at a given temperature over several orders of magnitude using chemical or electrical means. A layer is herein classified as a dielectric layer if it is not a semiconductor layer and it has a resistivity of about $10^7$ ohm-cm or greater. If the layer is to be a used as a dielectric component in an electronic device, it is preferred that it has a resistivity of about $10^{11}$ ohm-cm or greater, more preferably about $10^{14}$ ohm-cm or greater. A layer is herein classified as a conductor layer if it is not a semiconductor layer and it has a resistivity of about $10^6$ ohm-cm or less. If the layer is to be a functional conductive component of an electronic device, it is preferred that the resistivity of the layer be about 1 ohm-cm or less, more preferably about $10^{-4}$ ohm-cm or less, and most preferably about $10^{-5}$ ohm-cm or less.

In a preferred embodiment, the carrier layer is transferred during the transfer process to provide a multilayer transfer unit comprising a patterned nanoparticle layer and a patterned carrier layer on the thermal imaging receiver. The carrier layer can comprise a wide variety of materials including: refractive index modifiers, light absorbers, light emitters, nonlinear optical media, semiconductors, conductors, and dielectrics. Preferred carrier layers are conductor layers, dielectric layers and semiconductor layers and combinations thereof.

Following transfer, the carrier layer will lie on top of the patterned nanoparticle layer herein defined as the side of the nanoparticle layer opposite the base film; and can serve a planarizing, adhesive and/or to protective function for the nanoparticle layer. The carrier layer may also serve as a protective layer to prevent laser-induced damage and/or uphold the integrity of the nanoparticle layer during the transfer process. The carrier layer may also improve the adhesion of the nanoparticle layer to the receiver.

In another preferred embodiment of the present invention, the carrier layer does not serve a purpose other than to aid the transfer of the nanoparticle layer and potentially provide protection and adhesion during the transfer process. In such instances, it may be desirable to remove the carrier layer following transfer. For these cases, the carrier layer materials and exposure energies can be selected such that the carrier layer exhibits weak adhesion to the nanoparticle layer following transfer and can be readily removed by one or more step(s) selected from the group consisting of: blowing, peeling, vacuuming, and adhesive removal by contacting a tacky or electrostatic surface; to provide the patterned nanoparticle layer intact and adhered to the thermal imaging receiver. The term "intact" means generally that more than 50 wt % of the patterned nanoparticle layer is left intact. Preferably, more than 80 wt %, and most preferably, greater than 90 wt % of the nanoparticle layer is left intact. A suitable tacky surface for removal of the carrier layer is a commercial tape product comprising a free surface tacky layer with a Tg below the ambient conditions used for the adhesive removal.

Conducting and Resistive Layers

Conductors useful as carrier layers include π-conjugated organic polymers and doped versions of these polymers. Preferred polymers fall in one or more of the following categories: (a) stable conducting polymers such as polyaniline (PANI) and polyethylene dioxythiophene (PEDOT); (b) soluble or dispersable conducting polymers that form films using standard coating techniques, including PANI, PEDOT; and other alkyl- or alkoxy-substituted derivatives of conducting polymers such as poly(2,5 dialkoxy)paraphenylene vinylene and poly(3-hexyl)thiophene; and (c) conducting polymers that give high conductivity upon doping. Preferred conducting polymers, referred to herein as Conducting Polymers A, are selected from the group consisting of: polyaniline; polythiophene; polypyrrole; polyheteroaromatic vinylenes; and their derivatives. Descriptions of highly conductive polymers and methods for doping conductive polymers can be found in the following references: Bredas, J.-L. In *Handbook of Conducting Polymers*; Skotheim, T., Ed.; Marcel Dekker, Inc., New York, 1986, Vol. 2, Chapter 25; MacDiarmid, A. G., *Angew. Chem. Int. Ed.* 2001, 40, 2581-2590; and Heeger, A. J. *Angew. Chem. Int. Ed.* 2001, 40, 2591-2611. U.S. Pat. Nos. 5,863,465 and 5,370,825 describe the conducting and semiconducting properties of polyanilines. Organic acids, including plasticizing acids, are preferred dopants. Additional preferred dopants are conducting nanoparticles listed above. Preferred conducting nanoparticles as dopants are selected from the group consisting of: gold; silver; copper; and alloys thereof; ITO; ATO; carbon nanotubes; and mixtures thereof.

In preferred embodiments of the invention, the conductivity of polyanilines and derivatives thereof can be fine-tuned with dopants including organic acids and, optionally, carbon nanotubes to provide appropriate levels of conductivity, as described in US 2005/0116202, hereby incorporated by reference. Preferred carrier layer conductors comprise polyaniline dispersions of single wall carbon nanotubes (SWNT), preferably about 0.1 to 12 wt % SWNTs. Preferably the polyaniline and derivatives thereof are further doped with an organic protonic acid having 1 to 30 carbons, said acid at a mole equivalent amount of about 25% to about 100% of the nitrogen atoms in the polymer backbone. A preferred organic protonic acid is dinonylnaphthalene sulfonic acid (DNNSA).

The preferred thickness of conductors useful as carrier layers is about 0.01 to about 10 microns, preferably about 0.1 to about 5 microns, and more preferably about 0.2 to about 3 microns.

Conductive carrier layers can also include nonconducting polymers doped with conductive or resistive nanoparticles. Preferred nonconducting polymers useful in formulating conductive carrier layers are Nonconducting Polymers A, defined here as selected from the group consisting of: acrylic and styrenic-acrylic latexes and solution-based acrylic and styrenic-acrylic (co)polymers including random and graft copolymers and (meth)acrylate copolymers; and combinations thereof; copolymers of ethylene with one or more monomers selected from the group consisting of: (meth)acrylate(s), vinyl acetate, carbon monoxide and (meth)acrylic acid; and polyvinylacetate and its copolymers. Especially preferred solution-based and latex polymers of Nonconducting Polymers A have a Tg of about −50° C. to about 175° C., and more preferably, about −30° C. to about −90° C. Especially preferred solution-based polymers of this group are additionally characterized by a $M_w$ of about 10,000 to about 200,000. Additionally preferred nonconducting polymers, referred to herein as Nonconducting Polymers B, useful in forming conductive carrier layers are polyvinylpyrrolidone and its copolymers including polyvinylpyrrolidone-co-vinyl acetate. Preferred conducting nanoparticles as dopants are selected from the group consisting of: gold; silver; copper; and alloys thereof; ITO; ATO; carbon nanotubes; and mixtures thereof. Preferred doping is in the range of about 40 to about 90 wt % nanoparticles.

Semiconducting Layers

Semiconductors useful as functional carrier layers include organic semiconductors derived from π-conjugated organic compounds and polymers generally known in the art and disclosed in WO 03/052841 A1, hereby incorporated by reference. The synthesis and properties of conducting and semiconducting organic polymers is well known in the art. Several general references are available including "*Nobel Prize* 2000 *Lecture*" Alan MacDiarmid, *Current Applied Physics* 1, 2001, 269-279; and "*Handbook of Conducting Polymers*," Ed. by T. Skotheim, R. Elsenbaumer and J. Reynolds, 2nd ed., Marcel Dekker Inc., NY, 1998. U.S. Pat. Nos. 5,863,465 and 5,370,825, describe the conducting and semiconducting properties of polyanilines. Preferred thickness of these polymeric semiconductor carrier layers is about 0.05 to about 10 microns, preferably about 0.1 to about 5 microns and more preferably about 0.2 to about 3 microns. Preferred oligomeric and polymeric organic semiconductors, referred to herein as Semiconductors A include polyacene; polyphenylene; poly (phenylene vinylene); polyfluorene; polythiophene; poly(3, 4-bisubstituted thiophene); polybenzothiophene; polyisothianapthene; polypyrrole; polyfuran; polypyridine; poly-1,3,4-oxadiazoles; polyisothianaphthene; polyaniline; polyazulene; polyselenophene; polybenzofuran; polyindole; polypyridazines; polypyrene; polyarylamines; and their derivatives.

Dielectric Layers

Dielectric carrier layers include insulating polymers with or without various fillers, including pigments. Dielectric layers especially useful as functional carrier layers in devices include organic polymers and polymers combined with high K dielectric nanoparticles. Herein high K dielectric nanoparticles refer to nanoparticles with a dielectric constant of 20 and above, preferably 30 and above, and more preferably 100 and above.

In one embodiment of the invention, a dielectric layer useful as carrier layer 104 has a resistivity of about $10^{14}$ ohm-cm or greater comprising at least one layer of material, herein referred to as Layer A, comprising: one or more dielectric polymers selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly (vinyl acetate); and about 0.5 wt % to about 10 wt %, based on the dry weight of the Layer A, of one or more near-IR dye(s) characterized by an absorption maxima in the range of about 600 to about 1200 nm within Layer A. The term dielectric polymers herein encompasses homopolymers, copolymers derived from polymerization of two or more monomers, postderivatized (co)polymers including graft (co)polymers, and low molecular weight homopolymers or copolymers. The polymers may be linear, branched, hyperbranched or dendritic.

Preferred dielectric polymers for Layer A include acrylic, styrenic and styrenic-acrylic latexes comprising alkyl (meth) acrylate, styrene, and alkyl-substituted styrene wherein the alkyl group is a C1 to C18 straight or branched chain alkyl group. Preferred optional monomers for these latex-based polymers include (meth)acrylic acid, hydroxyethyl (meth) acrylate and glycidyl (meth)acrylate. More preferred acrylic, styrenic and styrenic-acrylic latexes are selected from the group: Latexes A, defined herein as one or more latex resins comprising at least about 85 wt %, preferably at least about 90 wt %, and more preferably at least about 95 wt %, of monomers selected from the group: alkyl (meth)acrylate, styrene, and alkyl-substituted styrene wherein the alkyl group is a C1 to C18 straight or branched chain alkyl group. Preferred optional monomers for these latex resins include (meth) acrylic acid, preferably up to about 5 wt %, hydroxyethyl (meth)acrylate, preferably up to about 10 wt %, and glycidyl (meth)acrylate, preferably up to about 5 wt %. Preferably the latexes have an average particle size of less than about 150 nm, more preferably, less than about 100 nm, and an acid number less than about 100, preferably less than about 75, and more preferably less than about 25.

Particularly preferred polymers for Layer A with high resistivity (above $10^{14}$ ohm-cm) are Acrylic Latexes B and Styrene Acrylic Latexes C and combinations thereof. Acrylic Latexes B are defined herein as one or more acrylic latexes comprising at least about 85 wt %, preferably at least about 90 wt %, and more preferably at least about 95 wt %, of monomers selected from the group consisting of: methyl methacrylate and butyl acrylate. Styrene Acrylic Latexes C are defined herein as one or more styrene-acrylic latexes comprising at least about 85 wt %, preferably at least about 90 wt %, and more preferably at least about 95 wt %, of monomers selected from the group consisting of: methyl methacrylate, butyl acrylate and styrene. Preferred optional monomers for Acrylic Latexes B and Styrene-Acrylic Latexes C are selected from the group consisting of: (meth)acrylic acid, preferably up to about 5 wt %, hydroxyethyl methacrylate, preferably up to about 10 wt %, and glycidyl methacrylate, preferably up to about 5 wt %. Commercial examples of acrylic and styrenic acrylic latexes useful as dielectric polymers include Joncryl® 95 and 1915 (co)polymers (Johnson Polymer). Methods for synthesizing suitable latex polymers have been reported in WO 03/099574.

Further preferred dielectric polymers for Layer A include solution-based acrylic, styrenic and styrenic-acrylic polymers. Herein the term "solution-based" refers to materials that are soluble in solvents such as water and/or one or more common organic solvents including alcohols, e.g. ethanol and butoxyethanol; ethers, e.g. dimethoxyethane; esters, e.g. ethyl and butyl acetate; ketones, e.g., acetone and 2-butanone; and aromatic hydrocarbons, e.g. xylenes. Preferred solution-based acrylic, styrenic and styrenic-acrylic polymers have a $M_w$ of less than about 100,000, preferably less than 50,000, and more preferably less than 30,000. Furthermore, preferred solution-based acrylic, styrenic and styrenic-acrylic polymers have an acid number less than about 250. Preferred solution-based acrylic, styrenic and styrenic-acrylic polymers comprise monomers selected from the group: alkyl (meth)acrylate, benzyl (meth)acrylate, styrene, and alkyl-substituted styrene wherein the alkyl group is a C1 to C18 straight or branched chain alkyl group. Preferred optional monomers for these solution-based polymers include (meth) acrylic acid and hydroxyethyl (meth)acrylate.

A particularly preferred material for Layer A is a combination of the acrylic, styrenic and styrenic-acrylic latexes and water-based acrylic, styrenic and styrenic-acrylic polymers described above. Preferably the combination comprises about 20 wt % to about 80 wt %, more preferably about 40 wt % to about 80 wt %, of an acrylic or styrenic-acrylic latex fraction and about 20 wt % to about 80 wt %, more preferably about 20 wt % to about 60 wt %, of a water-based acrylic or styrenic-acrylic polymer fraction, based on the dry weight of the combination.

Other preferred dielectric polymers for Layer A include heteroatom-substituted styrenic polymers selected from the group consisting of: partially hydrogenated poly(4-hydroxy) styrene, poly(4-hydroxy)styrene (PHS), and copolymers of PHS with hydroxyethyl (meth)acrylate, alkyl (meth)acrylate, styrene, and alkyl-substituted styrene wherein the alkyl group is a C1 to C18 straight or branched chain alkyl group. Particularly preferred comonomers are hydroxyethyl methacrylate, butyl acrylate, methyl methacrylate and styrene with hydroxyethyl methacrylate and butyl acrylate being especially preferred. The PHS (co)polymers may be linear or branched. When PHS homopolymer is used, the branched structure is preferred. Preferred (co)polymers of this class have a $M_w$ of less than about 30,000 and preferably less than about 20,000 and more preferably less than about 10,000. Partially hydrogenated PHS refers to PHS polymers that have been hydrogenated up to about 50 equivalent % of the unsaturation within the polymer and preferred polymers are hydrogenated to about 10 to 20 equivalent %. Commercial examples include PHS-B (branched PHS homopolymer; DuPont Electronic Technologies, Dallas, Tex.), Maruka Lyncur CMM (PHS copolymer with methyl methacrylate; Maruzen Petrochemical Co., LTD. Tokyo, Japan), Maruka Lyncur CHM (PHS copolymer with hydroxyethyl methacrylate; Maruzen), Maruka Lyncur CBA (PHS copolymer with butyl acrylate, Maruzen), Maruka Lyncur CST 15, 50, and 70 (PHS copolymers with styrene, Maruzen), and Maruka Lyncur PHM-C (partially hydrogenated PHS, Maruzen).

Other preferred dielectric polymers for Layer A include those selected from the group consisting of: phenol-aldehyde (co)polymers/(co)oligomers and combinations thereof. Preferred (co)polymers/(co)oligomers in this class are derived from mono- and bis-phenols and mono- and bis-aldehydes selected from the group consisting of: phenol; alkyl- and aryl-substituted phenols; formaldehyde; and alkyl-, aryl- and heteroatom-substituted aldehydes. The phenol-aldehyde resins can be further derivatized, e.g., the hydroxy group converted to an ether group. Preferred (co)polymers/(co)oligomers within this group have a $M_w$ of about 20,000 or less, preferably about 10,000 or less. Commercial examples include Novolac®/Novolak® resins (Schenectady International Inc., Schenectady N.Y.).

Other preferred dielectric polymers for Layer A include poly(vinyl acetate) homopolymer. Preferred polymers within this group have a $M_w$ of about 100,000 or less.

The above polymers may be plasticized for improved flexibility, is adhesion, compatibilization with an IR dye, among other characteristics. In certain instances, the plasticizer may be selected from the above classes of polymers. For example, a higher Tg or higher molecular weight (MW) phenol-aldehyde polymer can be blended with a lower Tg or lower MW phenol-aldehyde polymer. Another example is PHS blended with a phenol-aldehyde polymer. Examples of suitable plasticizers for some of the above classes of polymers comprise poly(ethylene) glycol, glycerol ethoxylate, di(ethyleneglycol) dibenzoate, and phthalate-based plasticizers such as dibutyl phthalate. A number of potentially suitable plasticizers for various polymers and details regarding their use may be found in the following reference: "*Handbook of Plasticizers*," Ed. G. Wypych, ChemTec Publishing, Toronto, Ont. 2004.

Layer A comprises about 0.5 wt % to about 10 wt %, and more preferably about 0.5 wt % to about 6 wt %, based on the dry weight of Layer A, of one or more near-IR dye(s) characterized by an absorption maxima of about 600 to about 1200 nm within the Layer A. Preferably the near-IR dye is chosen such that its absorption band overlaps with the emission band of the exposure laser used in the transfer process. Typically, the exposure laser emits radiation in the near-IR range. Preferred classes of dyes are the cyanine compound(s) selected from the group: indocyanines, phthalocyanines including polysubstituted phthalocyanines and metal-containing phthalocyanines, and merocyanines. A particularly preferred class of near-IR dye(s) is that of indocyanine dyes having absorption at about 830 nm. A number of suitable indocyanine dyes absorbing at around 830 nm and with solubility in different solvents and in water are available from H. W. Sands Co. and other sources. Preferred near-IR dyes for the invention are selected from the group: 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3-(4-sulphobutyl)-2H-benz[e]indol-2-ylidene) ethylidene)-1-cyclohexene-1-yl)ethenyl)-1,1-dimethyl-3-(4-sulphobutyl)-1H-benz[e]indolium, inner salt, free acid having CAS No. [162411-28-1]; and indolenine dyes corresponding to formulas (I) and (II) and resonance structures thereof:

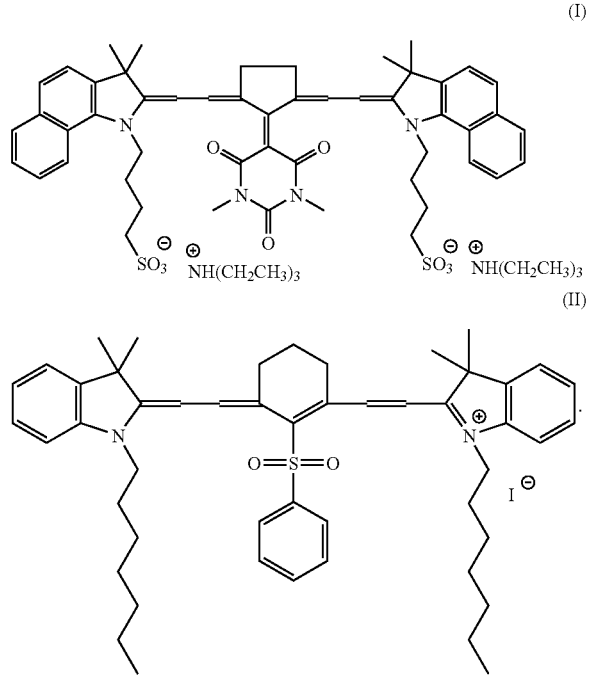

Preferred dye levels in the material will give a film OD of about 0.2 or greater, with an OD of about 0.5 to about 1.5 being preferred. To reach a preferred OD, unfilled water-based latex systems will typically require a higher dye loading of about 4 to 6 wt %. Unfilled solution-based systems will typically require lower dye loadings of about 0.5 to about 2 wt %.

In another preferred embodiment the dielectric layer comprises two or more Layers A that are gradient dye layers with each gradient dye layer independently characterized by a dry wt % of near-IR dye of about 0.5 to about 10 wt %; wherein at least one gradient dye layer has a lower wt % of near-IR dye, at least one gradient dye layer has a higher wt % of near-IR dye, and said higher wt % of near-IR dye is a value at least 20% higher than that of the lower wt % of near-IR dye.

In another preferred embodiment, the at least one Layer A further comprises a high K (high dielectric constant) nanoparticle fraction, of about 10 to about 90 wt % based on the dry weight of Layer A, with the nanoparticle fraction having a dielectric constant greater than about 20, and an average particle size of about 5 nm to about 500 nm. Herein high K dielectric nanoparticle fraction refers to nanoparticles with a dielectric constant of about 20 and above, preferably about 30 and above, and more preferably about 100 and above. Preferred dielectric polymers for practicing this embodiment are selected from the group: acrylic, styrenic and styrenic-acrylic latexes, solution-based acrylic, styrenic and styrenic-acrylic polymers, and combinations thereof; and phenol-aldehyde (co)polymers/(co)oligomers; as described above. Preferred high K dielectric nanoparticles for practicing this embodiment are selected from the group: barium titanate, strontium titanate, barium strontium titanate and titanium dioxide.

In another preferred embodiment the dielectric layer comprises two or more Layers A that are gradient nanoparticle layers with each gradient nanoparticle layer independently characterized by a dry wt % of high K nanoparticle fraction of about 10 to about 90 wt %; wherein at least one gradient nanoparticle layer has a lower wt % of high K nanoparticle fraction and at least one gradient nanoparticle layer has a higher wt % of high K nanoparticle fraction, and said higher wt % of high K nanoparticle fraction is a value at least 20% higher than that of the lower wt %.

In another preferred embodiment the dielectric layer further comprises an additional dielectric layer, herein referred to as Layer B, comprising one or more dielectric polymers, characterized by a resistivity of about $10^{14}$ ohm-cm or greater. Extensive lists of dielectric polymers can be found in WO 03/052841 and WO 06/024012. Preferred dielectric polymers for Layer B are selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly(vinyl acetate), as described above. This embodiment can be further practiced including other embodiments disclosed above. Preferred optional additives for Layer B include carbon black and high K nanoparticles with preferred high K dielectric nanoparticles for practicing this embodiment selected from the group consisting of: barium titanate, strontium titanate, barium strontium titanate and titanium dioxide.

Another preferred embodiment is wherein the dielectric layer has a resistivity of $10^{14}$ ohm-cm or greater and comprises at least one layer of material, herein referred to as Layer C, comprising one or more dielectric polymer(s) selected from the group consisting of: acrylic, styrenic and styrenic-acrylic latexes; comprising at least about 85 wt % of monomers selected from the group consisting of: alkyl (meth) acrylate, styrene, and alkyl-substituted styrene wherein the alkyl group is a C1 to C18 straight or branched chain alkyl group. This embodiment can be further practiced including other embodiments disclosed above. In one embodiment Layer C further comprises a high K nanoparticle fraction, up to about 90 wt % of the dry weight of Layer C, with the nanoparticle fraction having a dielectric constant greater than about 20, and an average particle size of about 5 nm to about 500 nm. Preferred optional additives for Layer C include carbon black and high K dielectric nanoparticles with preferred high K dielectric nanoparticles for practicing this embodiment selected from the group: barium titanate, strontium titanate, barium strontium titanate and titanium dioxide.

The Tg's of the dielectric polymers utilized in Layer A, Layer B and Layer C range from about −30 to about 150° C., preferably about 20 to about 90° C. and most preferably about 30 to about 70° C. Typically, the addition of fillers enables the utilization of lower Tg polymers and the addition of plasticizers enables the utilization of higher Tg polymers. The preferred Tg of the dielectric layer itself and of the layers utilized in the dielectric layer, including Layer A, Layer B, and Layer C is about 30 to about 100° C., preferably about 40 to about 85° C. and most preferably about 45 to about 65° C.

Layer A, optional Layer B and Layer C may include additives such as fillers, surfactants, defoamers, dispersants and grinding aids. Numerous surfactants, defoamers, dispersants and grinding aids are available that are suitable for this purpose. Selection will often be based upon observed coating and dispersion quality and the desired adhesion of the dielectric layer to other layers in the thermal transfer process. In certain embodiments, the surfactants comprise siloxy-, fluoryl-, alkyl- and alkynyl-substituted surfactants. These include the Byk® (Byk Chemie), Zonyl® (DuPont), Triton® (Dow), Surfynol® (Air Products) and Dynol® (Air Products) surfactants. Preferred surfactants are Byk® 345, 346 and 348 and Zonyl® FSO and FSN. In certain embodiments, the defoamers comprise alkyl and alkynyl functionality and include Surfynol® defoamers. In certain embodiments, the dispersants comprise functionalized polymers, oligomers and monomers and include Surfynol® and Disperbyk® dispersants.

Other dielectric polymers useful as dielectric carrier layers include the Nonconducting Polymers A and Nonconducting Polymers B described above.

The preferred thickness of the dielectric layer and of the layers utilized in the dielectric layer, including Layer A, Layer B and Layer C, is about 0.05 to about 10 microns, preferably about 0.1 to about 5 microns, and more preferably about 0.2 to about 3 microns.

Dielectric polymers filled with light-absorbing pigments make useful anti-reflective layers. Such layers are particularly useful when used as carrier layer or an additional transfer layer, below or on top of a conductive nanoparticle layer such as silver. A preferred pigment for this purpose is carbon black. Preferred compositions are about 1 wt % to about 90 wt % carbon black.

The light-attenuating agent of U.S. Pat. No. 6,645,681 referred to herein above may be incorporated into the carrier layer instead of, or additionally to, the base film. The nature of this light-attenuating agent will be dependent on the particular laser and printing system that is utilized. Dyes useful as attenuating agents for polymer-based carrier layers include Oil Blue N and Methylene Blue. The attenuating agent may constitute about 0.1 to about 15 wt % of the components of the thermally imagable carrier layer.

Fluid Dispersion of Nanoparticles

The donor element is prepared in part from a fluid dispersion consisting essentially of: a non-volatile fraction containing nanoparticles at a loading of about 65 to 100 wt %, and optionally, a dispersant at a loading up to about 35 wt %, based on the weight of the non-volatile fraction; and a volatile carrier fluid.

"Non-volatile fraction" refers to the fraction containing nanoparticles and dispersant that remains within the transfer layer after fabrication of the thermal imaging donor, which may, if desired, also include heating or drying of the thermal imaging donor.

"Dispersant" refers to non-volatile organic and inorganic material that is used as a carrier or matrix medium for the nanoparticles. The dispersant is comprised of one or more of the following components: polymers, oligomers, small molecules, binders, surface treatments, plasticizers, fillers, processing aids such as defoamers, surfactants, stabilizers, coating aids, pigments, dyes including IR dyes, and the like. The dispersant has several functions including: enabling the dispersion of the nanoparticles such that they are evenly distributed and coated; and contributing to the transfer properties, most notably the relative adhesion of the nanoparticle transfer layers to the carrier layer and the thermal imaging receiver in the thermal transfer process. The dispersant also may contribute to the functional properties of the transfer layers. For instance, the dispersant may be a dielectric, a semiconductor, or a conductor.

In one embodiment of the invention, the dispersant is composed of about 20% or more, more preferably about 40% or more, of a polymeric binder. One preferred class of dispersants include Graft Copolymers A as described in WO94/21701, referenced above. Other preferred (co)polymers/(co) oligomers useful as dispersants in the process of the invention include those defined earlier as conductor, semiconductor and dielectric layers including Conducting Polymers A, Nonconducting Polymers A, Nonconducting Polymers B, Semiconductors A, and the dielectric polymers described for Layer A, as defined above under the section entitled "Carrier layers." Conducting polymers selected from Conducting Polymers A are more preferred in cases wherein the nanoparticle transfer layers are functional conductors. Semiconductor dispersants selected from Semiconductors A are more preferred in cases wherein the nanoparticle transfer layers are functional semiconductors. Dielectric dispersants selected from the dielectric polymers described for Layer A are more preferred in cases wherein the nanoparticle transfer layers are functional dielectrics.

Lower molecular weight oligomers and small molecules useful as dispersants or components of the dispersant include surfactants and defoamers. Suitable surfactants and defoamers include those listed above for the carrier layer.

Preferably nanoparticles are at a loading of about 65-100 wt % of the nonvolatile fraction and more preferably, at least 70 wt %, 80 wt %, 90 wt % and 98 wt % of the nonvolatile fraction. However, the loading in any given case is dependent upon the nature of the nanoparticles, the carrier layer and the thermal imaging receiver. For instance, it has been found in practice that silver nanoparticles are best used at a loading of about 65 to about 93 wt % with an average longest dimension of about 5 nm to about 1500 nm; and a dispersant fraction of 7.0 to about 35 wt %. Preferably the silver nanoparticles are used at a loading of 85 to about 93 wt %.

By "volatile carrier fluid" we mean the fraction of the fluid dispersion that evaporates during fabrication of the thermal imaging donor, with additional heating, if so desired, but before the thermal printing process. Typically the volatile carrier fluid is water, an organic solvent, a gaseous material, or some combination thereof. The volatile carrier fluid is chosen to be compatible with the nanoparticles and any optional dispersant that is used. Supercritical fluids, those above the critical point pressures and temperatures, can act as volatile carrier fluids. A preferred supercritical fluid is carbon dioxide.

Additional Transfer Layers

One or more transfer layer(s) in addition to the nanoparticle layer(s) may be applied to the thermal imaging donor. The additional transfer layer(s) may be on top of nanoparticle layer, herein defined as the side of the nanoparticle layer opposite the base film; and/or the carrier layer may comprise two or more transfer layers. The additional transfer layer(s) may include one or more conductor, semiconductor or dielectric layers.

Preparation of the Thermal Imaging Donor

The thermal imaging donor comprising a nanoparticle layer is prepared by applying the fluid dispersion onto the free surface of the carrier layer on the thermal imaging substrate and volatilizing the carrier fluid. Applying the fluid dispersion can be accomplished by any method that gives a uniform layer, or if desired, a patterned or nonuniform layer of nanoparticles. Coating, including rod-coating, extrusion coating, gravure coating and spin-coating, spraying, printing, blading or knifing can be used. Coating and spraying are preferred methods for applying the fluid dispersion to provide uniform nanoparticle layers. Many commercial coating machines, devices such as a coating rod and knife blade, and printing machines can be used to apply the fluid dispersions. The carrier fluid is allowed to evaporate to provide the nanoparticle layer. The nanoparticle layer can be dried by any conventional method of drying including applying heat and vacuum.

Protective Strippable Cover Layer

Figure 1C:
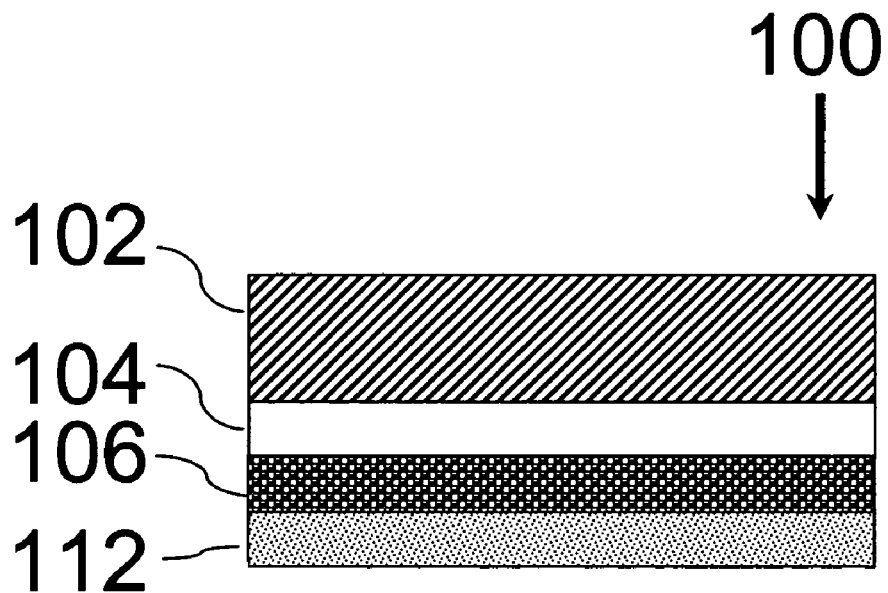

Optionally, a protective strippable cover layer may be present on the outmost layer of the thermal transfer donor. The cover layer protects the underlaying transfer layers and is easily removable. FIG. 1C is a cross-sectional view of thermal imaging donor 100 illustrating the presence of the cover layer. The thermal imaging donor 100 comprises a film 102, carrier layer 104, the nanoparticle layer 106, and a strippable cover layer 112. A preferred cover sheet is polyethylene film.

Thermal Imaging Receiver

Figure 2A:
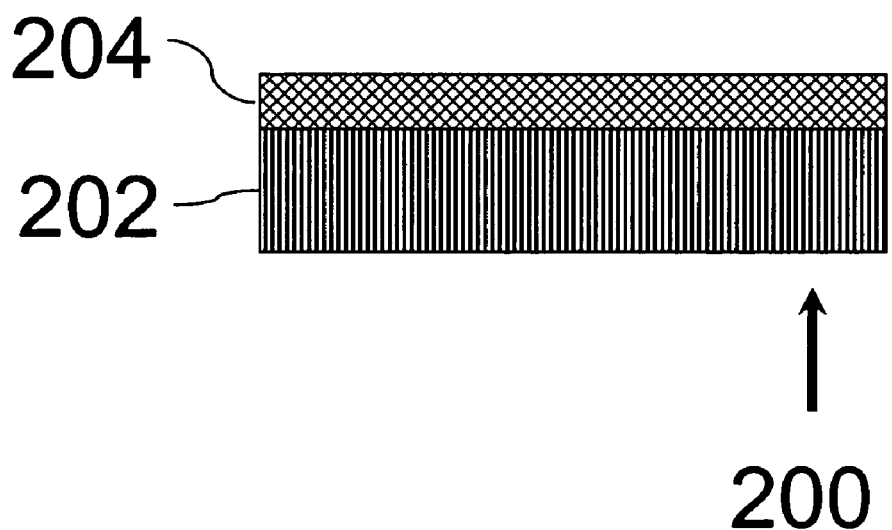
FIG. 2A is a cross-sectional view of a thermal imaging receiver in accordance with one embodiment of the invention.

FIG. 2A is a cross-sectional view of a thermal imaging receiver in accordance with one embodiment of the invention. Thermal imaging receiver 200 comprises receiver base film 202 and optional image receiving layer 204. The receiver base film 202 comprises a dimensionally stable sheet material as defined for the base film of the thermal imaging donor. Additionally, the receiver base film can be an opaque material, such as polyethylene terephthalate filled with a white pigment such as titanium dioxide; ivory paper; or synthetic paper, such as Tyvek® spunbonded polyolefin. The sheet material can also be glass. Preferred base films for receivers are polyethylene terephthalate, polyethylene naphthalate, triacetyl cellulose, polyimide, and glass.

The optional image receiving layer 204 facilitates adhesion of the thermal imaging receiver 200 to various transfer layers. Suitable image receiving layers 204 comprise a broad range of polymers including any of the (co)polymers/co(oligomers)/resins mentioned above in the description of the carrier layer. Typical polymers for the receiver layer are (meth) acrylic polymers, including (meth)acrylate homopolymers and copolymers, (meth)acrylate block copolymers, and (meth)acrylate copolymers containing other comonomer types, such as styrene. Preferred image receiving layers herein are Latexes B, as defined above. The receiver element may optionally include one or more additional layers between the receiver support and the image receiving layer including release layers, cushion layers and adhesive layers. Receiving elements suitable for use herein are disclosed as transfer elements in U.S. Pat. No. 5,565,301 and as receiver elements in WO 03/099574, both of which are hereby incorporated by reference. Alternate receiver elements are disclosed in U.S. Pat. No. 5,534,387, hereby incorporated by reference. Preferred cushion layers herein are ethylene vinylacetate copolymers (Elvax®, DuPont). Methods of roughening the receiver surface are described in WO 03/099574. A preferred roughening method herein is to bring the receiver surface in contact with a roughened sheet, typically under pressure and heat.

Contacting

The thermal imaging donor is contacted with a thermal imaging receiver. The contacting may occur with the nanoparticle layer of the donor; or with any optional layers that overlay the nanoparticle layer. By "contacted" is meant that the donor is in close proximity, preferably within several microns of the receiver. The receiver may be off-set from the donor by, for example, previously printed layers, fibers or particles that act as spacers to provide a controlled gap between donor and receiver. Vacuum and/or pressure can be used to hold the donor element 100 and the receiver element 200 together. As one alternative, the donor element 100 and the receiver element 200 can be held together by fusion of layers at the periphery of the assembly. As another alternative, the donor element 100 and receiver element 200 can be taped together and taped to the imaging apparatus. A pin/clamping system can also be used. As yet another alternative, the donor element can be laminated to the receiver element. If the donor element 100 and the receiver element 200 are flexible, the assembly can be conveniently mounted on a drum to facilitate laser imaging.

Transferring

Figure 2B:
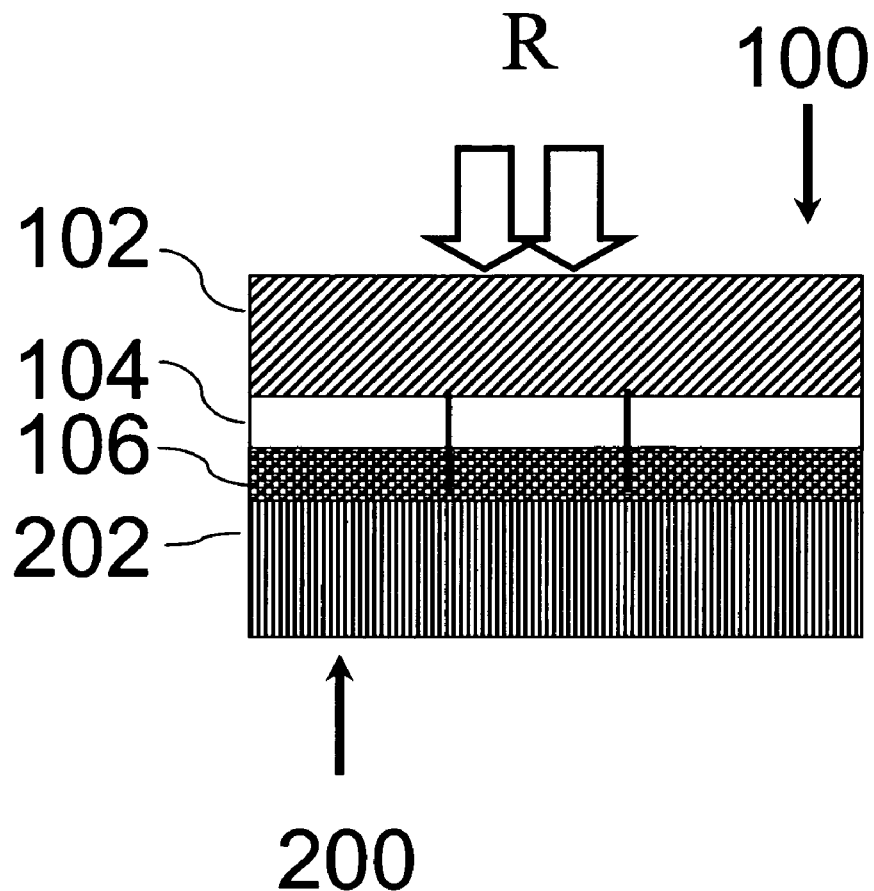
FIG. 2B is a cross-sectional view illustrating the thermal transfer process achieved by a laser-mediated transfer.

Thermal transfer can be achieved by a laser-mediated transfer process as illustrated in FIG. 2B. In one embodiment, the assembly of the donor element 100 and the receiver element 200 is selectively exposed to heat, which is preferably in the form of laser radiation (R), in an exposure pattern of the image of the desired pattern to be formed on the substrate. The laser radiation or laser beam (R) is focused about at the interface between 104 and 108, if present, otherwise it is focused about at the interface between 104 and 102. Sufficient radiation is applied to achieve transfer of the nanoparticle and carrier layers to the receiver.

A variety of light-emitting sources can be used to heat the thermal transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Other light sources and irradiation conditions can be suitable based on, among other things, the donor element construction, the transfer layer material, the mode of thermal transfer, and other such factors.

The radiation is preferably applied through the backside of base film 102, that is, the side not containing the nanoparticle layer. Laser radiation preferably is provided at a laser fluence of up to about 600 mJ/cm$^2$, and more preferably about 75-440 mJ/cm$^2$. Lasers with an operating wavelength of about 350 nm to about 1500 nm are preferred. Particularly advantageous are diode lasers, for example those emitting in the region of about 750 to about 870 nm and up to 1200 nm, which offer a substantial advantage in terms of their small size, low cost, stability, reliability, ruggedness and ease of modulation. Such lasers are available from, for example, Spectra Diode Laboratories (San Jose, Calif.). One device used for applying an image to the receiver is the Creo Spectrum Trendsetter 3244F, which utilizes lasers emitting near 830 nm. This device utilizes a Spatial Light Modulator to split and modulate the 5-50 Watt output from the ~830 nm laser diode array. Associated optics focus this light onto the imagable elements. This produces 0.1 to 30 Watts of imaging light on the donor element, focused to an array of 50 to 240 individual beams, each with 10-200 mW of light in approximately 10×10 to 2×10 micron spots. Similar exposure can be obtained with individual lasers per spot, such as disclosed in U.S. Pat. No. 4,743,091. In this case each laser emits 50-300 mW of electrically modulated light at 780-870 nm. Other options include fiber-coupled lasers emitting 500-3000 mW and each individually modulated and focused on the media. Such a laser can be obtained from Opto Power in Tucson, Ariz.

Suitable lasers for thermal imaging include, for example, high power (>90 mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more.

At least a portion of the nanoparticle layer and a corresponding proximate portion of the carrier layer is transferred onto the thermal imaging receiver by thermal transfer to provide, in layered sequence, a patterned nanoparticle layer and patterned carrier layer. The term "corresponding proximate portion of the carrier layer together" means that the transference of the nanoparticle layer onto the receiver includes a simultaneous matching transference of the exposed carrier layer residing adjacent the nanoparticle layer onto the receiver. In embodiments wherein the carrier layer comprises more than one layer or additional transfer layers are present on top of the nanoparticle layer, these layers are transferred in a like manner. The portions may be identical in area or they may be substantially identical in area. By the latter we mean that the portions may not be exactly precise or 1:1 correspondence. By substantially identical is meant the invention encompasses cases wherein the nanoparticles, for instance nanotubes, may stick out beyond the perimeter of the patterned carrier layer. The invention also encompasses cases wherein the carrier layer at the perimeter of the thermal image may not transfer fully intact, possibly due to perimeter variations in the thermal process, or other reasons.

Figure 3A:
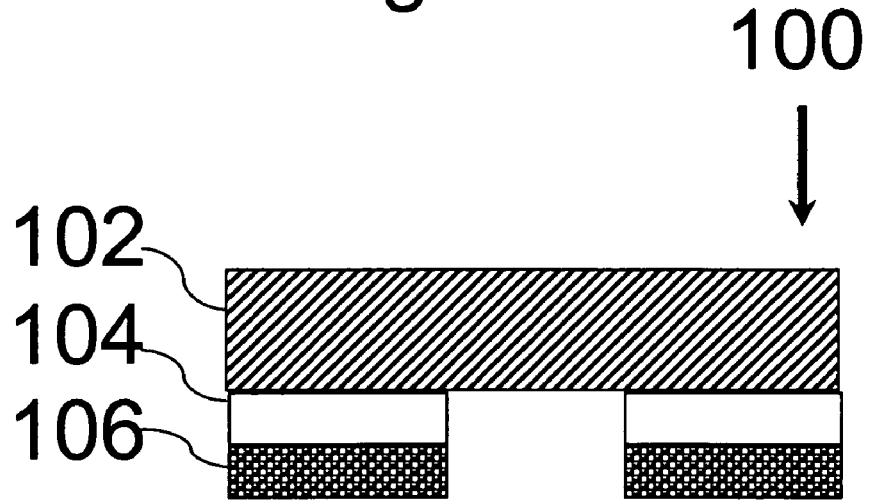
FIGS. 3A and 3B illustrate the thermal donor and receiver elements after laser-mediated transfer and separation of the elements.
Figure 3B:
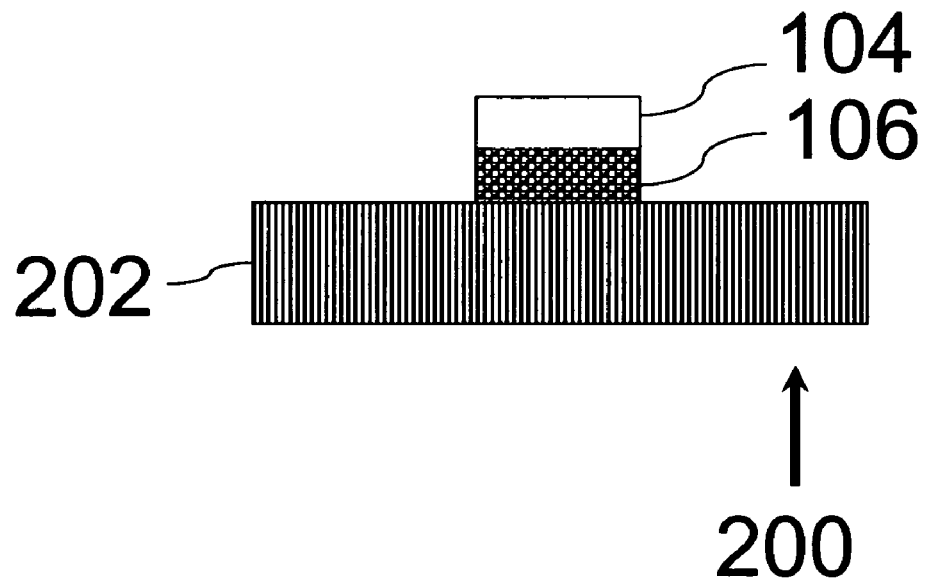

After exposure, the donor element 100 and the receiver element 200 are separated, as illustrated in FIGS. 3A and 3B, leaving the untransferred portions of the nanoparticle layer 106 and the carrier layer 104 on the donor element 100 and the imaged portions of the nanoparticle layer 106 and the carrier layer 104 on the receiver element 200. Usually the separation of the donor and receiver is achieved by simply peeling the is two elements apart. This generally requires very little peel force and is accomplished by simply separating the donor element from the receiver element. This can be done using any conventional separation technique and can be manual or automatic.

Either or both of the spent donor element (a negative of the image) and the imaged receiver element (a positive of the image) may be useful as a functional object. Furthermore, either or both of the spent donor element and the imaged receiver element may be utilized as the permanent substrate or the image may be transferred from the spent donor or receiver, preferably by lamination, to the permanent substrate.

Usually the transferred portions of the transfer layers correspond to those portions of the transfer layers exposed to laser radiation. In some instances, depending upon the nature of the donor and receiver elements and the transfer processing parameters, when the donor element 100 and the receiver element 200 are separated, the receiver element includes both exposed portions and non-exposed portions of one or more transfer layers. A process for enhancing the resolution of a pattern on a thermal imaging receiver comprising an exposed portion and a non-exposed portion of one or more thermal transfer layers on a surface of the thermal imaging receiver comprises: (a) contacting said surface of the thermal imaging receiver with an adhesive surface to provide a temporary laminate; and (b) removing said adhesive surface from the temporary laminate to provide a thermal imaging receiver with a surface substantially free of said non-exposed portion of one or more transfer layers. Suitable adhesive surfaces for performing the process are commercial adhesive tapes, for instance, those Scotch® brand tapes available from 3M company. Tacky rollers, for instance, a medium tack roller available in the form of a Dust Removal System-1 (red) from SDI (Systems Division, Inc., Irvine, Calif. 92618-2005) are a suitable adhesive surface for the process. Chrome films, used as LTHC layers described above, also make useful low tack adhesive layers for removing non-exposed portions of the transfer layers under very gentle conditions.

Figure 3C:
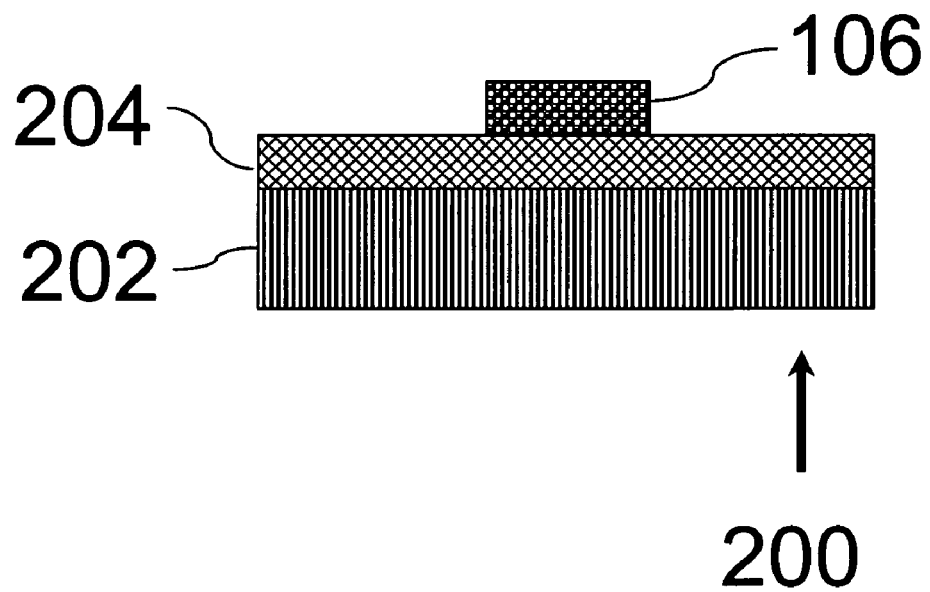
FIG. 3C illustrates a thermal receiver element after removal of the patterned carrier layer.

The process of the invention encompasses a step of removing the is patterned carrier layer from the receiver element 200. FIG. 3C illustrates the embodiment wherein the receiver sheet includes an adhesive layer and carrier layer 104 has been removed. Peeling or blowing may be used to remove the carrier layer from the receiver as described above. Use of a tacky or electrostatic sheet may aid the removal process.

Figure 4A:
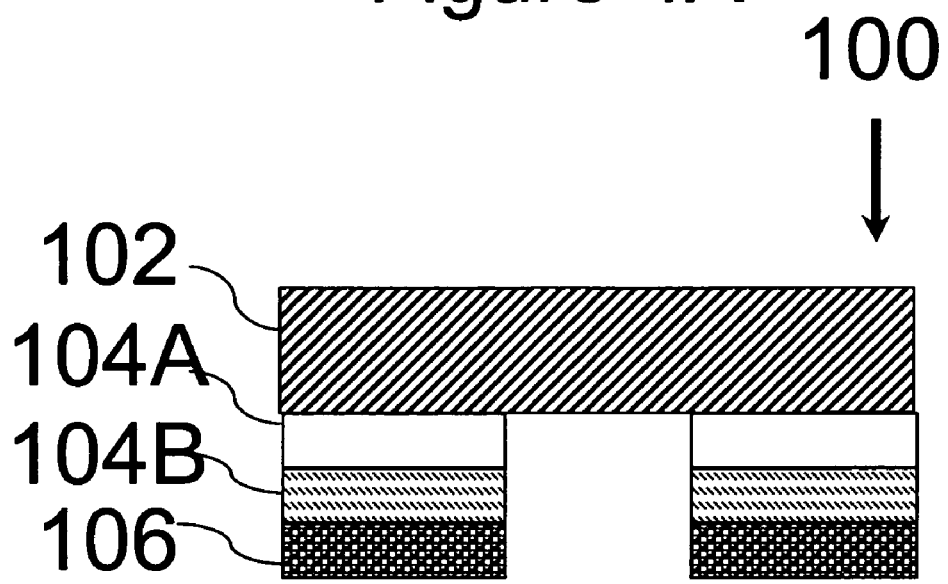
FIGS. 4A and 4B illustrate thermal donor and receiver elements after laser-mediated transfer using a carrier layer comprising two layers 104A and 104B.
Figure 4B:
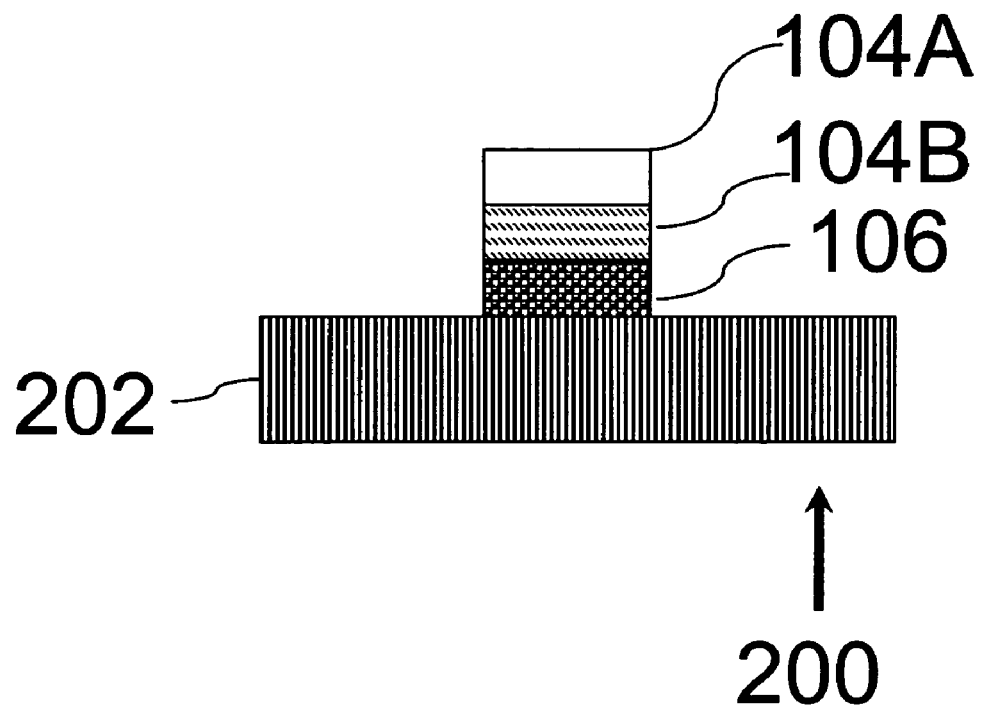
Figure 4C:
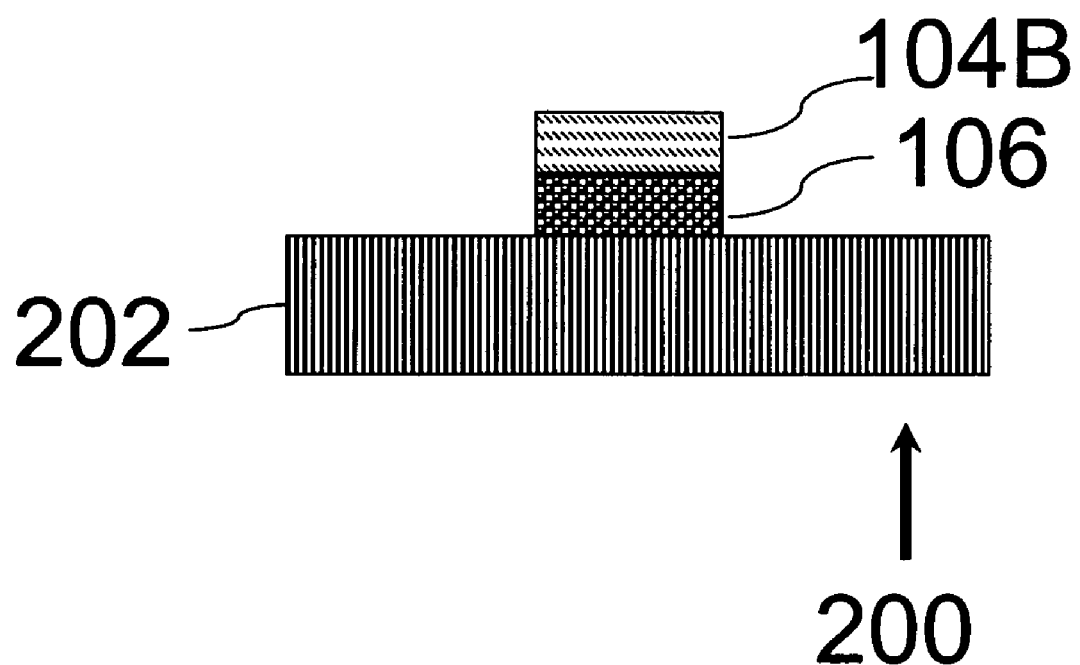
FIG. 4C illustrates another embodiment of the invention wherein one transfer layer of the carrier layer has been removed.

The process further encompasses a step of placing a patterned layer on the patterned nanoparticle layer. This latter process may be achieved simultaneously with the transfer of the nanoparticle layer as illustrated in FIG. 4A, using a carrier layer comprising two transfer layers 104A and 104B. The corresponding receiver layer (FIG. 4 B) provided by the thermal transfer step includes, in layered sequence, said receiver, the patterned nanoparticle layer, and the patterned carrier layer comprising patterned transfer layers 104B and 104A. The patterned transfer layer 104A may be removed, as described above, to provide the patterned nanoparticle layer and patterned transfer layer 104B as illustrated in FIG. 4 C. Alternatively, one or more patterned layers may be thermally transferred to the patterned nanoparticle layer in a separate step. Preferred polymer layers include those selected from the group: conductors, semi-conductors and dielectrics.

Figure 5A:
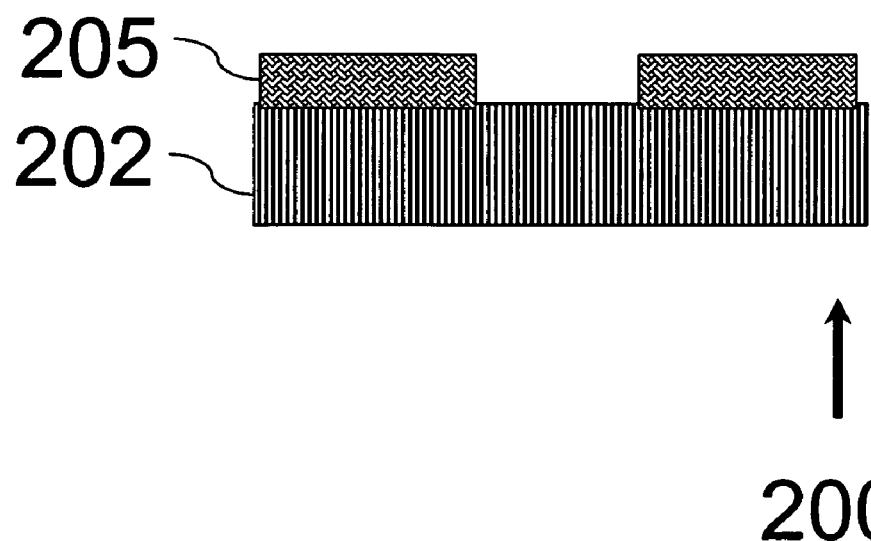
FIGS. 5A and 5B illustrate cross-sectional views of thermal imaging receivers comprising patterned layers.
Figure 5B:
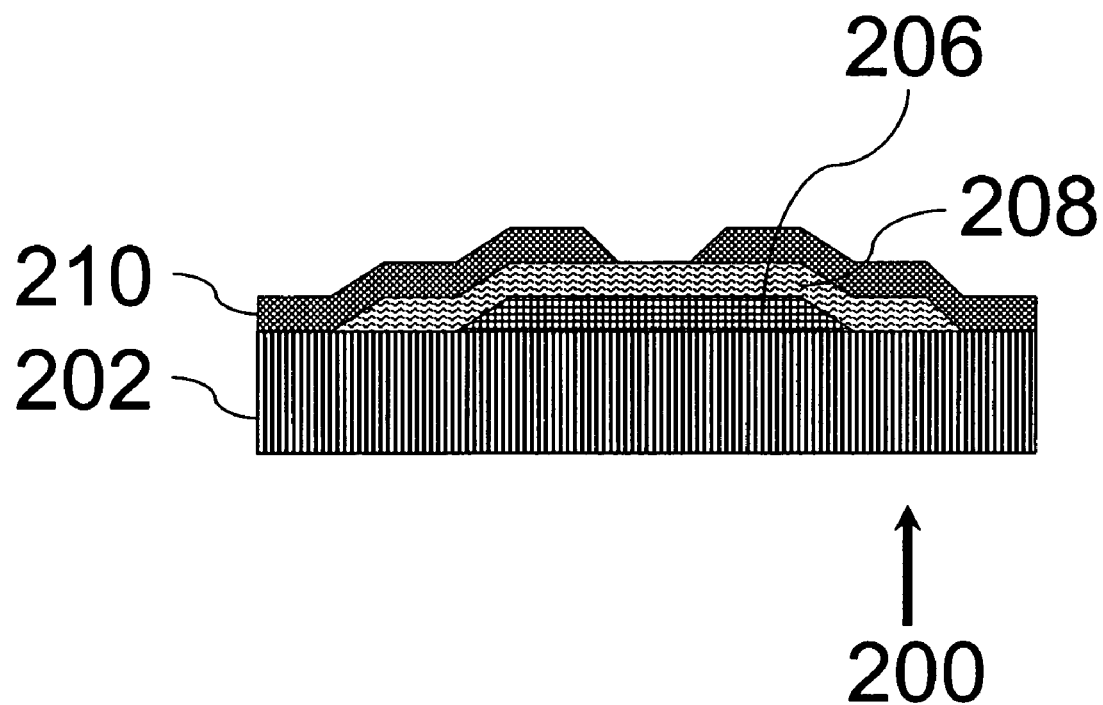

FIG. 5A is a cross-sectional view of thermal imaging receiver 200, in accordance with another embodiment of the invention. Thermal imaging receiver 200 comprises base film 202 and at least one patterned layer 205. Patterned layer 205 is selected from a group consisting of patterned semiconductor layers, patterned conductor layers and patterned dielectric layers. FIG. 5B is a cross-sectional view of thermal imaging receiver 202, in accordance with yet another embodiment of the invention. Thermal imaging receiver 200 comprises base film 202, a patterned gate conductor layer 206 on base film 202, a patterned dielectric layer 208 on gate conductor layer 206 and a patterned source/drain conductor layer 210 on dielectric layer 208. Articles of various compositions can be made from the above process. FIGS. 3B, 3C, 4B, 4C, 6A and 6B illustrate a few such compositions for electronic applications.

Various electrical elements that can be formed, at least in part, by is the use of the present invention include electronic circuitry, resistors, capacitors, diodes, rectifiers, electroluminescent lamps, memory elements, field effect transistors, bipolar transistors, unijunction transistors, thin film transistors, metal-insulator-semiconductor stacks, organic transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezo-electric devices, ferroelectric devices, thin film batteries, or combinations thereof; for example, the combination of field effect transistors and organic electroluminescent lamps as an active matrix array for an optical display.

Figure 6A:
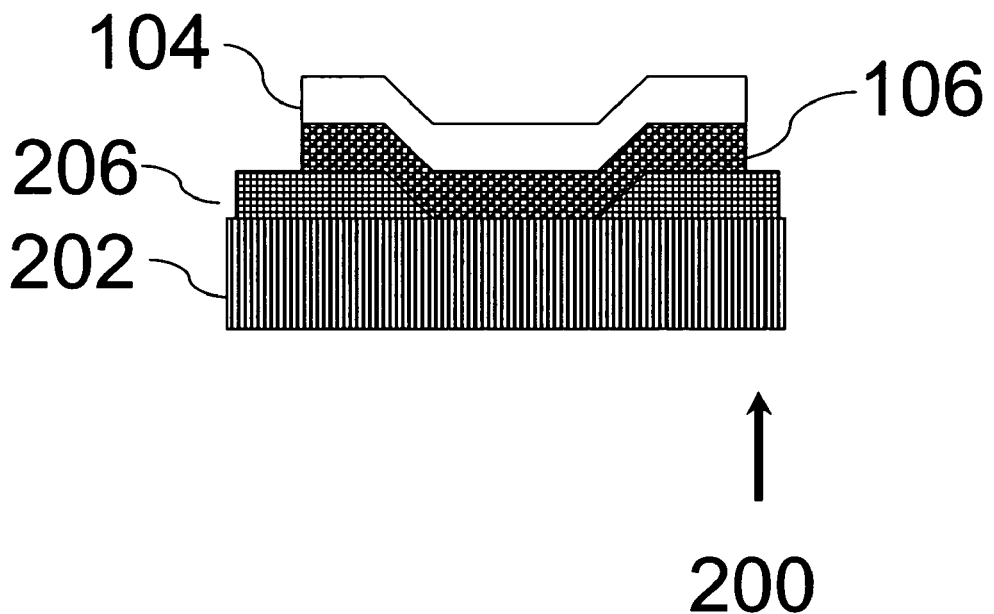
FIGS. 6A and 6B illustrate cross-sectional views of compositions provided by processes of the invention.

FIG. 6A is a cross-sectional view of a composition, which is made in accordance with another embodiment of the invention. The composition comprises thermal imaging receiver comprising base film 202 and at least one patterned layer 206 and a patterned nanoparticle layer 106 and carrier layer 104 dispersed on the surface of thermal imaging receiver 200. Patterned layer 206 comprises material selected from a group comprising patterned semiconductor layers, patterned conductor layers and patterned dielectric layers. The patterned thermally imagable carrier layer 104 may be optionally removed from on top of patterned nanoparticle layer 106.

Figure 6B:
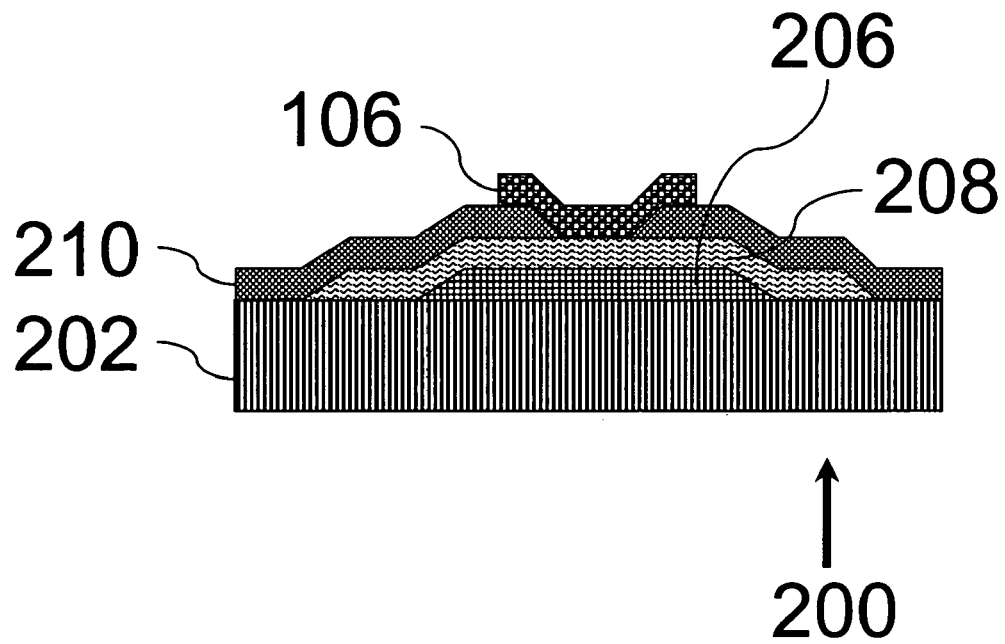

FIG. 6B is a cross-sectional view of a composition, which is made in accordance with yet another embodiment of the invention. The composition comprises thermal imaging receiver comprising base film 202, patterned gate conductor 206 layer on base film 202. The thermal imaging receiver further comprises patterned dielectric layer 208 on gate conductor layer 206, and patterned source/drain conductor layer 210 on dielectric layer 208, and the patterned nanoparticle layer 106 dispersed on patterned source/drain conductor layer 210. The carrier layer 104 has been removed from on top of the nanoparticle layer 106. The arrangement of the various layers of the composition can vary in different is embodiments.

In another embodiment of the invention the thermal imaging donor includes one or more additional transfer layer(s) disposed on the side of the nanoparticle layer opposite the base film, herein defined as on top of the nanoparticle layer. Following the process of the invention, the one or more additional transfer layer(s) is contacted to the thermal imaging receiver and thermal transfer process proceeds. Transferring includes transfer of a corresponding proximate portion of the one or more said additional transfer layer(s) onto the thermal imaging receiver to provide, in layered sequence on said receiver, patterned additional transfer layer(s), the patterned nanoparticle layer and the patterned carrier layer.

Another embodiment of the invention includes a carrier layer comprising two or more transfer layers. The thermal transfer process includes transfer of a corresponding proximate portion of the two or more transfer layer(s) onto the thermal imaging receiver to provide in layered sequence, said receiver, the patterned nanoparticle layer, and the patterned carrier layer comprising two or more transfer layers. A preferred multilayer carrier layer includes a semiconducting transfer layer on top of a dielectric transfer layer.

The additional transfer layer(s) preferably are selected from the group consisting of: conductor, semiconductor and dielectric layers; and preferred materials are as described above for the respective carrier layers. Preferred additional transfer layers more specifically include conducting layers and dielectric layers when a conducting nanoparticle layer is being transferred; and a semiconducting layer and dielectric layer when a semiconducting nanoparticle layer is being transferred. Another preferred additional transfer layer is a dielectric layer that also acts as an adhesive layer. This may allow strong adhesion of the patterned nanoparticle layer to the thermal imaging receiver and allow subsequent removal of the patterned carrier layer without damaging the nanoparticle layer.

The present invention enables single-step deposition of nanoparticles on various types of substrates including conductors, semiconductors and dielectrics. The process of deposition is dry and hence does not involve solvent incompatibility issues with any layers, which may already have been deposited. The process does not require any pre-patterning steps, or any other selective area surface treatment, to place the nanoparticles in the desired configuration.

The present invention is further defined in the following Examples. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various uses and conditions.

Materials

Unless otherwise indicated, chemicals were used as received without further purification. Solvents were purchased from Aldrich and VWR and were of reagent-grade purity or higher; HPLC grade and preferably electronic grade solvents were used when available. Water was deionized water, HPLC grade water from Aldrich, or purified water. Polymers, plasticizers, IR dyes, and surfactants were obtained from the sources listed in the specification or purchased from Aldrich. Pigments such as carbon black dispersions were obtained from Penn Color, Inc., Doylestown, Pa. Silver nanoparticles were purchased from Ferro Co.—Electronic Material Systems (Ultrafine Ferro RD&S 7000-35 Ag powder: particle size d50=220 nm and d90=430 nm). All raw polyester films were obtained from DuPont Teijin Films (Wilmington, Del.).

Donor Substrates

Cr LTHC Layer. A base film of polyethylene terepthalate (PET, 50 microns thick in all examples unless stated otherwise) was coated with chrome metal in a vacuum deposition chamber by CP Films of Martinsville, Va. Metallization was carried out on PET films with and without light attenuating agents (670 nm absorbers). The chrome layer was coated at both 50% T and 40% T. In the examples, these donor films will be referred to as: 40% T Cr PET donor substrate and as 50% T Cr PET donor substrate; for the metallized films without light attenuating agents. The donor films with 670 nm absorbers incorporated in the base film will be referred to as: 40% T Cr Blue PET donor substrate and as 50% T Cr Blue PET donor substrate.

Organic LTHC Layer. The organic LTHC layer was prepared as reported in Formulation L of the Examples of PCT/US05/38009, referenced above:

A LTHC coating formulation was prepared from the following materials: (i) demineralised water: 894 g; (ii) dimethylaminoethanol: 5 g; (iii) Hampford dye 822 (Hampford Research; formula corresponds to SDA 4927): 10 g; (iv) polyester binder (Amertech Polyester Clear; American Inks and Coatings Corp; Valley Forge; Pa.): 65 g of a 30% aqueous solution; (v) TegoWet™ 251(4) (a polyether modified polysiloxane copolymer, Goldschmidt): 2.5 g; (vi) potassium dimethylaminoethanol ethyl phosphate: 14 g of an 11.5% aqueous solution [The 11.5% aqueous solution was prepared by combining three parts water and 0.5 parts ethyl acid phosphate (Stauffer Chemical Company, Westport, Conn.: Lubrizol, Wickliffe, Ohio) and sufficient 45% aqueous potassium hydroxide to achieve a pH of 4.5, followed by addition of sufficient dimethylaminoethanol to achieve a pH of 7.5 and finally dilution with water to achieve five parts total of final aqueous solution of 11.5 relative mass percent of water-free compound.]; (vii) crosslinker Cymel™ 350 (a highly methylated, monomeric melamine formaldehyde resin, Cytec Industries Inc. West Paterson, N.J.): 10 g of a 20% solution; and (viii) ammonium p-toluene sulphonic acid: 2 g of a 10% aqueous solution.

Ingredients (ii) and (iii) were added to the water and allowed to stir for up to 24 hours before addition of the other ingredients in the order shown. There was no need to filter this formulation. The formulation was applied in an in-line coating technique as follows: The polymer base film composition was melt-extruded, cast onto a cooled rotating drum and stretched in the direction of extrusion to approximately 3 times its original dimensions at a temperature of 75° C. The cooled stretched film was then coated on one side with the LTHC coating composition to give a wet coating thickness of approximately 20 to 30 μm. A direct gravure coating system was used to apply the coatings to the film web. A 60QCH gravure roll (supplied by Pamarco) rotates through the solution, taking solution onto the gravure roll surface. The gravure roll rotates in the opposite direction to the film web and applies the coating to the web at one point of contact. The coated film was passed into a stenter oven at a temperature of 100-110° C. where the film was dried and stretched in the sideways direction to approximately 3 times its original dimensions. The biaxially stretched coated film was heat-set at a temperature of about 190° C. by conventional means. The coated polyester film is then wound onto a roll. The total thickness of the final film was 50 μm; the dry thickness of the transfer-assist coating layer is of 0.07 μm. The PET support layer contained either Disperse Blue 60 or Solvent Green 28 dye to give a final dye concentration of typically 0.2% to 0.5% by weight in the polymer of the substrate layer. The polymer composition containing the Disperse Blue 60 dye (0.26% by weight) had an absorbance of 0.6±0.1 at 670 nm, and an absorbance of <0.08 at 830 nm. The polymer composition containing the Solvent Green 28 dye (0.40% by weight) had an absorbance of 1.2 at 670 nm, and an absorbance of <0.08 at 830 nm. These donor substrates will herein be referred to as: Organic LTHC Blue PET donor substrate and Organic LTHC Green PET donor substrate.

Coating

Coating of transfer and other layers onto donor and receiver elements was carried out utilizing stainless steel wrapped and formed 0.5 inch diameter coating rods purchased from R.D. Specialties, Inc. (RDS; Webster, N.Y.) and chrome-plated stainless steel formed 0.625 inch diameter rods with a CN profile purchased from Buschman Corporation (Cleveland, Ohio). The donor free surface was cleaned with a pressurized nitrogen stream immediately prior to coating to rid the surface of particle contamination. The coatings were drawn by hand on a smooth glass surface or machine-coated utilizing either a WaterProof® Color Versatility coating system (CV coater) manufactured by DuPont De Nemours Inc. is (Wilmington, Del.) or a slot-die coater.

Coatings were stored in a controlled temperature/humidity environment with an average temperature of about 68° C. and about 40-50% average relative humidity.

Conductor Electrical Characterization

The sheet resistance and resistivity of conducting lines were obtained by measuring the resistance of lines with known geometries. A Cascade MicroTech (Beaverton, Oreg.) probestation model Alessi REL-6100 and a semiconductor parameter analyzer Agilent Technologies (Palo Alto, Calif.) model 4155C were used to apply a current across the lines and measure voltage drops at two known positions within the line. Typically, currents were swept from $1\times10^{-5}$ A to $-1\times10^{-5}$ A to obtain voltages in the mV to V range. The slope of the I-V curve and the line geometry were used to obtain resistance, sheet resistance and resistivity. From these values conductivity and conductance can be calculated.

Thermal Imaging Equipment and Donor Mounting

Creo Trendsetter® 800 (Creo/Kodak, Vancouver, Canada) was utilized. The Creo Trendsetter® 800 was a modified drum-type imager utilizing a modified Thermal 1.7 Head with a 12.5 watt maximum average operating power at a wavelength of 830 nm with 5080 dpi resolution. The 800 Trendsetter was operated in a controlled temperature/humidity environment with an average temperature of −68° C. and an average relative humidity of ~40-50%. For each printing experiment, a section of thermal imaging receiver was positioned on the drum. The thermal imaging donor was loaded so that the side of the donor element coated with the transfer layer was facing the free side of the receiver. Imaging assemblages were exposed from the back side through the donor film base. Films were mounted using vacuum hold down to a standard plastic or metal carrier plate clamped mechanically to the drum. In some experiments utilizing the Creo Trendsetter® 800 thermal platesetter, a nonstandard drum with vacuum holes machined directly onto the drum to match common donor and receiver sizes was used as a replacement for the standard drum/carrier plate assemblage. Contact between the donor and receiver was established by ~600 mm of Hg vacuum pressure. Laser output was under computer control to build up the desired image pattern. Laser power and drum speed were controllable and were adjusted in an iterative fashion to optimize image quality as judged by visual inspection of the transferred image on the receiving surface.

Latex Binder Preparation

Latex binders that were used in the preparation of certain donor and receiver elements were prepared according to the procedures of WO 03/099574 with the materials reported in Table 1. Compositions are reported in Table 2 and were characterized by the analytical methods reported in WO 03/099574. Monomers and initiators were commercially available (Aldrich Chemical Co., Milwaukee, Wis.) and used as received. The surfactant was Polystep® B-7, a 29 wt % solution of ammonium lauryl sulphate in water (Stepan Co., Northfield, Ill.).

TABLE 1

Materials for the Synthesis of Acrylic Latex Resins

| Reagent (grams) | Acrylic Latex Resin | | | |
|---|---|---|---|---|
| | A-1 | A-2 | A-3 | A-4 |
| Polystep B-7 | 6.90 | 6.90 | 6.9 | 6.9 |
| Ammonium Persulfate | 0.20 | 0.20 | 0.40 | 0.4 |
| Methyl Methacrylate | 180.0 | 20.0 | 288.0 | 280.0 |
| Butyl Acrylate | 0 | 320.0 | 160.0 | 100.0 |
| Methacrylic Acid | 12.0 | 12.0 | 12.0 | 12 |
| Glycidyl Methacrylate | 8.0 | 8.0 | 8.0 | 8.0 |
| Styrene | 200.0 | 40.0 | 0 | 0 |

TABLE 2

Composition and Analytical Data for Latex Resins

| Latex | Solids | MMA | BA | MAA | STY | GMA | Particle Diameter (nm) | Tg (° C.) | Mn/ 1000 | Mw/ 1000 |
|---|---|---|---|---|---|---|---|---|---|---|
| Latex A-1 CAS# 25035-81-8 | 33.3 | 45 | 0 | 3 | 50 | 2 | 95 | 111 | 43 | 343 |
| Latex A-2 CAS# 25987-66-0 | 32.7 | 5 | 80 | 3 | 10 | 2 | 83 | −21 | 96 | 319 |
| Latex A-3 CAS# 25035-69-2 | 33.4 | 55 | 40 | 3 | | 2 | 94 | 39 | | |
| Latex-A-4 CAS # 25035-69-2 | 33.5 | 70 | 25 | 3 | | 2 | 92 | 72 | | |

MMA: Methyl Methacrylate;
BA: Butyl Acrylate;
MAA: Methacrylic Acid;
STY: Styrene;
GMA: Glycidyl Methacrylate Receivers Surface-treated 5 mil Melinex ST504 (DuPont Teijin Films) was used as received. R-1 PET receivers with an acrylic latex image receiving layer were prepared according to the procedure of WO 03/099574 (Flexible Receiver FR-1 Procedure) by slot-die coating an acrylic latex polymer dispersion with Zonyl® FSA as the surfactant onto 4 mil Melinex® 574 base film (DuPont-Teijin Films). The acrylic latex polymers were prepared as described above and their compositions are reported in Table 2. The R-1 receiver formulation was prepared as listed in Table 3.

TABLE 3

Receiver Materials

| Materials | Receiver R-1 |
|---|---|
| Latex A-4 (33% Solids) | 2173 g |
| Latex A-3 (33% Solids) | 3259 g |
| (N,N-Dimethylethanolamine) 10% in H$_2$O | 75.0 g |
| Water (distilled) | 8713 g |
| Zonyl FSA | 30.0 g |
| Butyl Cellosolve | 750 g |
| % Solids | 12% |
| Coating Weight | 13 mg/dm$^2$ |
| Receiver Base Film | 4 mil Melinex ® 574 |
| Polyethylene Cover Sheet | No |

General Procedure for the Preparation of Aqueous Dielectric Layers

A water solution was prepared by combining the specified amounts of water and, optionally, a 3 wt % ammonium hydroxide solution. Next, the IR dye, one-fourth of the water solution, and optional defoamers, is surfactants and plasticizers were combined in a brown glass container and mixed well. The optional second binder was weighed in a container together with one-fourth of the water solution and mixed well. Optional pigment(s) were weighed in another container with one-fourth of the water solution and mixed well. The binder was weighed in a large container with a stir bar and any remaining water solution was added. The contents of the second binder dispersion, the IR dye dispersion, and the pigment dispersion were slowly added to the stirring binder. After stirring for at least 15 additional minutes, the formulation was filtered into a brown or foiled-coated container. Syringe filters with 0.45 micron pore size were used unless specified otherwise (25 mm GD/X Glass Microfiber GMF with Propylene Housing; Cat. No. 6894-2504 Whatman, Whatman Inc., Clifton, N.J.).

General Procedure for Dispersing Silver Nanoparticles

The silver dispersion was treated with a sonication probe (Dukane Co. Model 40TP200, Transducer Model 41C28) for 15 min while stirring the mixture with a spatula at 5 min intervals. Next, the container with the mixture was placed in a water bath with sonication for 1 h while stirring the mixture with a spatula at 0.5 h intervals. The mixture was then treated in a room temperature water bath with probe sonication for an additional 15 minutes, during which time the mixture was stirred gently with a spatula at 5-minute intervals. The resulting dispersion was filtered twice with 2.0 micron Whatman® MGF-150 syringe-disc filters.

EXAMPLE 1

This example illustrates the process of the invention wherein alumina nanorods with no polymer dispersant are applied to a thermal imaging substrate comprising a base film, LTHC layer and a blue pigmented acrylic latex carrier layer, and transferred to a thermal imaging receiver with laser radiation.

Preparation of Alumina Nanorod Fluid Dispersion.

Aluminum isopropoxide (45.5 g) and aluminum sec-butoxide (60 g) were stirred in 0.085 M HCl (3 L) for 10 days. The solution was then heated at 150° C. for 22 h at a pressure of 4 bar (nitrogen) in a glass shaker tube to provide a solution of alumina (Al$_2$O$_3$) nanorods. The nanorods so formed are about 15 nm in diameter and about 200 nm in length. The solution was concentrated to about 3 wt % upon evaporation.

Fabrication of the Thermal Imaging Donor Substrate with a Carrier Layer.

A blue-pigmented carrier layer was prepared as follows:
Pigment Dispersion:

An aqueous graft copolymer dispersant (60 wt %) was prepared as described in the above referenced WO 94/21701. It consisted of 69 wt % of n-BA/MA/AA (45.5/45.5/9) grafted with 31 wt % of MMA/MAA (71.25/28.75). A 15 wt % solids pigment dispersion was prepared with a 4:1 pigment to dispersant ratio by first mixing 2001 g of aqueous graft copolymer dispersant (60 wt %), 218.109 g of aminomethylpropanol, and 32998.49 g of water. The resulting mixture was dispersed together with 4802.4 g of Irgalite Blue Glo Pigment (Ciba; C.I. Pigment Blue 15:3; CAS 147-14-8) in a 10 gallon Dynomill bead mill using 0.8-1.0 mm Zirconia media and a recirculation loop with a time in the Dynomill of 90 seconds/half-pint.

Formulation Preparation:

The general aqueous carrier layer formulation procedure was followed by combining about 157.5 parts of water, 398 parts of the Irgalite Blue Glo dispersion (15 wt %), 60 parts of Latex A-1 (33 wt %), 9.09 parts of Latex A-2, 2.5 parts of SDA 4927, 0.40 parts of Zonyl® FSA (25 wt %), and 2.98 parts of a 2:1 adduct of caprolactone and 1,4-cyclohexanedimethanol added together with 36.12 parts of Latex A-1 (33 wt %) to give a 15 wt % solids dispersion.

Coating Preparation:

The 15 wt % solids carrier layer formulations was slot-die coated onto the chrome layer of a 50% T Cr PET donor substrate and allowed to dry down to a thickness of 13.7 mg/dm$^2$ to provide the thermal imaging substrate with a carrier layer. The dry carrier layer coating had the following composition: 59.7 wt % of the Irgalite Blue Glo dispersed pigment, 0.1 wt % Zonyl® FSA, 2.5 wt % SDA 4927, 31.7 wt % Latex A-1, 3.0 wt % Latex A-2 and 3.0 wt % of a 2:1 adduct of caprolactone and 1,4-cyclohexane dimethanol.

Applying the Fluid Dispersion onto the Carrier Layer.

The thermal imaging substrate (20 cm by 30 cm) was placed on a flat sheet of glass with the carrier layer facing up. The 3 wt. % alumina nanorod dispersion (5 mL) was dispensed from a syringe through a nylon filter (5 micron pore size) along one short edge of the donor. Using a #4 wrapped stainless steel RDS coating rod, the bead of solution was hand-drawn into a uniform thin film covering the carrier layer of the thermal imaging substrate. The film was dried, resulting in a thin coating of alumina nanorods on top of the carrier layer.

Thermal Transfer Process.

The donor and a thermal imaging R-1 receiver were loaded into the Creo Trendsetter® 800 thermal platesetter according to the procedure described above. A pattern of 1 cm wide by 2.5 cm long rectangles was imaged a total of eleven times utilizing 830 nm radiation. Each image was printed at a different power level setting of the CREO 800 Trendsetter®, from 3 W to 12 W in 0.5 W steps. The drum of the CREO Trendsetter® was set to rotate at 170 rpm for all power levels. Printing parameters were as follows: surface depth=95 and surface reflectivity=0.320. Above 6.5 W, the blue-pigmented acrylic latex carrier polymer and the nanoparticle transfer layer transferred from the donor sheet to the receiver sheet, following the pattern of 1 cm wide rectangles, resulting in the controlled, patterned deposition of the nanorods onto the surface of the receiver substrate. From this initial scan of the power level, it was visually determined that 8 W was the optimum power for transfer patterning the nanorods and carrier layer. A complex test pattern of narrow lines, squares and components for fabricating printed capacitors and transistors was printed at 8 W at 170 rpm drum speed on the CREO 800 Trendsetter®, demonstrating the patterned deposition of the carrier layer and nanorods on the small length scales appropriate to the fabrication of printed electronic and other functional devices.

EXAMPLE 2

This example illustrates the process of the invention wherein barium titanate nanoparticles are applied to a thermal imaging substrate comprising a base film comprising a 670 nm absorber, a LTHC layer and a Novolac carrier layer, and transferred to a thermal imaging receiver with laser radiation. Portions of the Novolac carrier layer were later removed with tape.

Preparation of Barium Titanate Nanoparticle Dispersion.

Barium titanate nanoparticles were prepared according to the procedure of O'Brien, S.; Brus, L.; Murray, C. B. *J. Am. Chem. Soc.* 2001, 123, 12085-12086. Oleic acid was utilized as the stabilizing agent for the nanoparticles in this procedure to give approximately 8 nm diameter nanoparticles. The isolated barium titanate nanoparticles were combined with p-xylene to give a 10 wt % fluid dispersion, which, was shaken continuously prior to coating.

Fabrication of the Thermal Imaging Donor Substrate with a Carrier Layer.

A solution of Novolac® HRJ14198 (3.168 g, Schenectady International) and Tic-5c (0.032 g, Hampford Research, Inc.) in acetone (10.8 g) and 2-methoxyethanol (1.28 g) was prepared and shaken overnight. A portion of this solution was hand-coated with a #3 formed stainless steel RDS coating rod onto the Cr layer of a 50% T Cr Blue PET donor substrate (30 cm×20 cm) and allowed to dry in air to provide the thermal imaging donor substrate with a carrier layer.

Applying the Fluid Dispersion onto the Carrier Layer.

The thermal imaging substrate was placed on a flat surface with the carrier polymer layer facing up. The 10 wt % barium titanate dispersion (~4 mL) was dispensed along one of the 8" edges of the substrate. Using a #9 formed stainless steel RDS coating rod, the dispersion was hand-drawn into a uniform thin film covering the carrier layer of thermal imaging substrate. The film was dried in air to provide a thermal imaging donor.

Thermal Transfer Process.

The donor and a thermal imaging R-1 receiver (28 cm×18 cm) were loaded into the Creo Trendsetter® 800 thermal platesetter according to the procedure described above. A pattern of 1 cm wide by 2.5 cm tall rectangles was imaged a total of eleven times. Each image was printed at a different power level, from 7.5 W to 12.5 W in 0.5 W steps. The drum was set to rotate at 170 rpm at all eleven powers. Printing parameters were as follows: surface depth=105 and surface reflectivity=0.308. The Novolac HRJ14198/barium titanate nanoparticle bi-layer transferred from the donor sheet to the receiver sheet at all eleven power levels, following the pattern of 1 cm wide rectangles, resulting in the controlled, patterned deposition of the barium titanate nanoparticles onto the receiver substrate. Visual inspection of the donor indicated that >80% transfer occurred at powers of 7.5 W and higher and >95% transfer occurred at powers of 10 W and higher.

Removal of the Carrier Layer.

The receiver substrate was stored in a sealed plastic bag under air at room temperature following the printing experiment. During this time, the Novola® carrier layer turned to a yellow-brown color. Approximately two years following the transfer printing of the barium titanate nanoparticles and the Novolac carrier layer, pieces of Scotch® tape were placed on portions of the printed regions at 8.0 W and 12.5 W. The pieces of tape were left in place less than one minute and then peeled off, removing the corresponding portions of the yellowed Novola® carrier layer and leaving the white nanoparticle layer behind.

EXAMPLE 3 (Comparative)

This example illustrates a process wherein barium titanate nanoparticles are applied to a thermal imaging substrate comprising a base film comprising a 670 nm absorber, a LTHC layer and no carrier layer, which is then thermally imaged with laser radiation. Comparison of printing results of Example 2 versus Example 3 illustrates the usefulness of the carrier layer in aiding the transfer process, enabling transfer to occur at high yields at lower energies. Comparison of Example 2 versus Example 3 also illustrates the usefulness of the carrier layer in serving as an adhesive layer, enabling the nanoparticles to maintain a continuous film throughout the transfer process and adhere to the receiver.

Preparation of Barium Titanate Nanoparticle Dispersion.

The barium titanate nanoparticle dispersion was prepared as described in Example 2.

Applying the Fluid Dispersion onto the Carrier Layer.

A 50% T Cr Blue PET donor (30 cm×20 cm) was placed on a flat surface with the Cr layer facing up. The 10 wt % barium titanate dispersion (~4 mL) was dispensed along one of the 8" edges of the substrate. Using a #11 formed stainless steel RDS coating rod, the dispersion was hand-drawn into a uniform thin film covering the Cr layer of thermal imaging substrate. The film was dried in air to provide a thermal imaging donor.

Thermal Transfer Process.

The donor and a thermal imaging R-1 receiver (28 cm×18 cm) were loaded into the Creo Trendsetter® 800 thermal platesetter according to the procedure described above. A pattern of 1 cm wide by 2.5 cm tall rectangles was imaged from 3.0 W to 12.0 W in 0.5 W steps at a drum speed of 170 rpm. Printing parameters were as follows: surface depth=105 and surface reflectivity=0.336. Visual examination of the donor indicated that transfer was incomplete with approximately 25% transfer or greater occurring at powers of 9 W and higher. A faint corresponding pattern on the receiver was observed. The energy of the transfer process was increased by printing the pattern of 1 cm wide by 2.5 cm tall rectangles from 3.0 W to 12.0 W in 0.5 W steps at a drum speed of 100 rpm. Visual examination of the donor indicated that >50% transfer of the nanoparticles in the patterned areas occurred at 8 W and higher and >80% transfer occurred at 10.5 W and higher. Adhesion of the nanoparticles to the receiver was observed in a small fraction of the patterned areas at 7.5 and 8 W, but not at 8.5 W and above.

EXAMPLE 4

This example illustrates the process of the invention wherein silver nanoparticles with 10 wt % dispersant are applied to a thermal imaging substrate comprising a base film, an organic LTHC layer and a black acrylic latex carrier layer, and transferred to a thermal imaging receiver.

Preparation and Coating of Carrier Layer.

General aqueous carrier layer formulation procedure was followed using 11.18 g of Joncryl® 538 (45 wt %), 0.025 g of SDA 2860, 0.050 g of Byk® 348, 1.820 g of Carbon Black Acroverse Paste 32B56 (33 wt %; Penn Color), and 18.72 g of water to give a formulation with a pH of 9.10. The resulting solution (3 mL) was coated onto the Organic LTHC-Green PET donor substrate (~90 by 52 cm) with a CN#2 formed Buschman rod at 9.8 ft/min and dried at 45° C. for 6 minutes. The composition of the final dry coating was: 88.2 wt % Joncryl® 538, 0.4 wt % SDA 2860, 0.9 wt % Byk® 348, and 10.5 wt % Black 32B56.

Preparation and Coating of Silver Dispersion.

A mixture of Ultrafine RD&S 7000-35 Ag powder (22.530 g), 20% Elvacite® 2028 (12.550 g, 20 wt % in xylenes.), xylenes (12.516 g) and di(ethylene glycol) dibenzoate (0.048 g) was dispersed according to the above general procedure. The dispersion (6 mL) was coated onto the black carrier layer at a speed of 5.8 ft/min with a #6 CN formed Buschman rod and dried at 42° C. for 20 minutes.

Thermal Transfer Process.

A portion of the donor (~30×20 cm) and a thermal imaging Melinex® ST 504 receiver (~28×18 cm) were loaded into the Creo Trendsetter® 800 thermal platesetter according to the procedure described above. Contact between the donor and receiver was established by 600 mm of Hg vacuum pressure. Blocks of serpentine patterns were printed with 200, 100, and 50 micron line widths with spacing between the lines equivalent to the line width. Printing parameters were as follows: surface depth=71; surface reflectivity=0.28; escan=3. The patterns were printed at drum speed 120 (5-8 W in 0.25 W increments), drum speed 80 (3.75 W-6.75 W in 0.25 W increments) and drum speed 40 (2.5-5.5 W in 0.25 W increments). At drum speed 120, transfer was observed at 5.75 W and above with >90% transfer being observed at 6.7-8 W. At drum speed 80, transfer was observed at 4.25 W and above with >90% transfer being observed at 5-6.75 W. At drum speed 40, transfer was observed at 5 W and above with >90% transfer being observed at 5.75-8 W.

Electrical Characterization.

Sheet resistance was measured according to the standard procedure given above. Rsh<1 ohm/sq was measured for lines printed at drumspeed 40 at 7.25 W and above.

EXAMPLE 5

This example illustrates the process of the invention wherein silver to nanoparticles with 10 wt % dispersant are applied to a thermal imaging substrate comprising a base film, a chrome LTHC layer and a black soluble acrylic carrier layer, and transferred to a thermal imaging receiver.

Preparation and Coating of Carrier Layer.

General aqueous carrier layer formulation procedure was followed using 14.14 g of Joncryl® 63 (30 wt %), 0.025 g of SDA 2860, 0.50 g of Byk® 348 (10 wt %), 2.70 g of Carbon Black Acroverse Paste 32B56 (33 wt %; Penn Color), 2.50 g of glycerol ethoxylate (20 wt %), and 11.94 g of water to give a formulation with a pH of 8.96. The resulting solution (3 mL) was coated onto a 40% T Cr Blue PET donor substrate (~90 by 52 cm) with a CN#2 formed Buschman rod at 9.8 ft/min and dried at 45° C. for 6 minutes. The wt % solids of the final dry coating was: 74.32 wt % Joncryl® 63, 0.4 wt % SDA 2860, 0.9 wt % Byk® 348, 15.6 wt % Black 32B56 and 8.8 wt % glycerol ethoxylate.

Preparation and Coating of Silver Dispersion.

The formulation, dispersion and coating conditions are identical to those of Example 4.

Thermal Transfer Process.

A portion of the donor (~30×20 cm) and a thermal imaging Melinex® ST 504 receiver (~28 cm×18 cm) were loaded into the Creo Trendsetter® 800 thermal platesetter according to the procedure described above. Blocks of serpentine patterns were printed with 200, 100, and 50 micron line widths with spacing between the lines equivalent to the line width. Printing parameters were as follows: surface depth=71; surface reflectivity=0.3; escan=3. The patterns were printed at drum speed 100 (5.75-8.75 W in 0.25 W increments), drum speed 70 (5.25-8.25 W in 0.25 W increments) and drum speed 40 (3.5-6.5 W in 0.25 W increments). Transfer was >90% complete at all powers and drum speeds.

Electrical Characterization.

Sheet resistance was measured according to the standard procedure given above. Rsh<1 ohm/sq was measured for lines printed at drumspeed 40 at 4.25 W and above and at drumspeed 70 at 7.5 W and above.

EXAMPLES 6-10

Latex Binder Preparation for Examples 6-10

Latex binders that were used in the preparation of certain donor elements were prepared and characterized according to the procedures and methods reported in the section entitled "Latex Binder Preparation" with the materials reported in Table 4.

Chain Transfer Agent: This material was prepared as described in U.S. Pat. No. 5,362,826, Berge, et. al.: A 500 liter reactor was equipped with a reflux condenser and nitrogen atmosphere. The reactor was charged with methyl ethyl ketone (42.5 kg) and isopropyl-bis(borondifluorodimethylglyoximato) cobaltate (III) (Co III DMG) (104 g) and the contents brought to reflux. A mixture of Co III DMG (26.0 g), methyl methacrylate (260 kg), and methyl ethyl ketone (10.6 kg) was added to the reactor over a period of 4 hours. Starting at the same time, a mixture of Vazo 67® (DuPont, 5.21 kg) and methyl ethyl ketone (53.1 kg) was added to the reactor over a period of 5 hours. After the additions, the reactor contents were kept at reflux for another ½ hour. After cooling, this yielded 372 kg of a 70 wt % solution of Chain Transfer Agent (a chain transfer agent solution), which was used directly in the polymerizations. Compositions are reported in Table 5.

TABLE 4

Materials for the Synthesis of Latex Resins Used in Examples 6-10

| | Acrylic Latex Resin | | |
|---|---|---|---|
| Reagent (grams) | L-56-3 | L-33-3 | L-34-1 |
| Polystep ® B-7 | 6.90 | 6.90 | 6.90 |
| Ammonium Persulfate | 0.20 | 0.20 | 0.20 |
| Methyl Methacrylate (MMA) | 252.0 | 228.0 | 236.0 |
| Butyl Acrylate (BA) | 120.0 | 160.0 | 160.0 |
| Methacrylic Acid (MAA) | 12.0 | 12.0 | 4.0 |
| Chain Transfer Agent Solution | 16 | 0 | 0 |

TABLE 5

Composition and Analytical Data for Latex Resins Used in Examples 6-10

| Latex | Solids Wt % | MMA Wt % | BA Wt % | MAA Wt % | Chain Transfer Agent Solution Wt % | Particle Diameter (nm) | Tg (° C.) | Mn/1000 | Mw/1000 |
|---|---|---|---|---|---|---|---|---|---|
| L-56-3 | 32.6 | 63 | 30 | 3 | 4 | 75 | 56 | 57 | 135 |
| L-33-3 | 33.3 | 57 | 40 | 3 | 0 | 93 | 33 | 244 | 1399 |
| L-34-1 | 33.4 | 59 | 40 | 1 | 0 | 93 | 34 | 235 | 1539 |

MMA: Methyl Methacrylate;
BA: Butyl Acrylate;
MAA: Methacrylic Acid.

Preparation of Dispersions for Ag Layers of Examples 6-10

The dispersions were prepared according to the general procedure for dispersing silver nanoparticles given above with the materials reported in Table 6.

TABLE 6

Materials for Ag Nanoparticle Layers of Examples 6-10

| | | Metal Powder | | | Dispersant | | Additives | |
|---|---|---|---|---|---|---|---|---|
| Entry No. | Solvent (g)[a] | M/wt %[b] | d50/d90 (nm)[c] | Wt. (g) | ID | Wt % | Dry wt. (g) | ID[d] | Dry wt. (g) |
| 1 | Xylenes 15.006 | Ag/89.8 | 220/430 | 22.502 | Elvacite ® 2028[e] | 20 | 2.501 | DGD | 0.057 |
| 2 | Xylenes 17.601 | Ag/88.8 | 350/730 | 20.042 | Elvacite ® 2028[e] | 20 | 2.476 | DGD | 0.063 |
| 3 | DI H$_2$O 15.427 | Ag/87.1 | 220/430 | 26.250 | Joncryl ® 538[f] | 45 | 3.762 | Zonyl FSA 25 wt %[g] | 0.133 |
| 4 | Xylenes 8.810 | Ag/88.6 | 350/730 | 10.031 | Elvacite ® 2028[e] | 20 | 1.240 | DGD/ SDA 4733 | 0.026/0.027 |

[a]DI = deionized.
[b]Weight % of the metal in the dry film.
[c]Spherical particles were utilized unless indicated otherwise.
[d]DGD = diethylene glycol dibenzoate.
[e]Solution in xylenes.
[f]Solution in water.
[g]Solution in 1:1 water:isopropanol.

EXAMPLE 6

PANI-CNT—Ag Nanoparticle Multi-Layer

This example illustrates the process of the invention wherein a thermal imaging substrate was fabricated with a base film; chrome LTHC layer; and polyaniline-carbon nanotube (PANI-CNT) and silver transfer layers in layered sequence. Thermal transfer onto a receiver comprising a surface-treated base film gave a receiver element with a base film, surface treatment, and patterned silver and PANI-CNT layers in layered sequence. Post-processing steps improved line-edge quality.

A. Preparation of PANI-CNT—Ag Nanoparticle Multi-Layer Donor Substrate (a) Preparation and coating of polyaniline layer. A mixture of HiPco Raw CNT (0.1219 g, from Carbon Nanotechnologies, Inc., Houston, Tex.), Disperbyk® 163 (0.067 g, BYK Chemie USA Inc., Wallingford, Conn.) 1,2-dichlorobenzene (8.855 g) and xylenes (20.662 g) was treated in a room temperature water bath with a sonication probe (Dukane Co. Model 40TP200, Transducer Model 41C28) for 10 minutes, during which time the mixture was stirred gently with a spatula at 5 minute intervals. Then PANI-DNNSA [7.325 g, 22.23% by wt. in xylenes and 2-butoxyethanol (4:1 ratio) with 0.7 acid doping, synthesized according to U.S. Pat. No. 5,863,465] was added into the above mixture and the mixture was placed in a 45° C. water bath for 5 minutes. After equilibration of the temperature, the mixture was treated with sonication for 5 minutes, during which time the mixture was stirred gently with a spatula at one-minute intervals. The resulting dispersion was filtered through 1.0 micron Nitex® 03-1/1 nylon screen (mesh count 690×470, Pore size: 1 micron, Sefar America Inc., Depew, N.Y.). Into the filtrate was added 30.5 microliter of a 10 wt % solution in xylenes of Triton® X 114 (Union Carbide Co, Danbury, Conn.). The dispersion (10.9 mL) was coated onto a 40% T Cr PET donor substrate (~90 by 52 cm) using a CV coater at 5.8 ft/min with a CN#12 formed Buschman rod and dried at 40° C. for 25 minutes.

(b) Preparation and coating of silver layer. The components of the silver formulation and dispersion are described in entry 2 of Table 6 above. The dispersion (7 mL) was coated onto the PANI-CNT layer on the 40% T Cr PET donor substrate using a CV coater at 5.8 ft/min with a CN#6 formed Buschman rod and dried at 48° C. for 20 minutes.

B. Thermal Transfer Process for Patterning PANI-CNT—Ag Nanoparticle Multi-layer.

A portion of the multi-layer donor (~30 cm×20 cm) and a thermal imaging Melinex® ST 504 receiver (~28 cm×18 cm) were loaded into the Creo Trendsetter® 800 thermal platesetter according to the procedure described above. Blocks (4.75 cm×1.5 cm) of serpentine patterns were printed with 200, 100, and 50 micron line widths with spacing between the lines equivalent to the line width. Printing parameters were as follows: surface depth=47; surface reflectivity=0.52; escan=0. The patterns were printed at drum speed 120 (7.5-10.75 W in 0.25 W increments) and drum speed 60 (4.5-8 W in 0.25 W increments).

C. Thermal Transfer Evaluation and Post-processing.

Transfer was incomplete at drum speed 60. Transfer was complete at drum speed 120 but, with the exception of the 200 micron lines printed at 9.25 W and above, material in non-exposed regions between the printed lines was transferred along with the lines. Contact of an adhesive surface (Scotch® tape, 60 sec) with the 50 micron lines printed at drum speed 120 at 9.75 W selectively removed the material between the lines to yield the desired 50 micron serpentine pattern on the receiver with clean line edges and no line breaks.

D. Electrical Characterization.

Sheet resistance was measured according to the standard procedure given above. Rsh of less than 1 ohm/sq was measured for lines printed at drum speed 120 at 7.75 W and above, with Rsh measuring 0.4 ohm/sq at 10 W and above.

EXAMPLE 7

PANI-CNT—Ag Nanoparticle—Dielectric Multi-Layer

This example illustrates the process of the invention wherein a thermal imaging substrate was fabricated with a base film; chrome LTHC layer; and PANI-CNT, silver, and dielectric transfer layers in layered sequence. Thermal transfer onto a receiver comprising a surface-treated base film gave a receiver element with a base film, surface treatment, and patterned dielectric, silver and PANI-CNT layers in layered sequence. Thermal transfer onto a receiver comprising a surface-treated base film with a patterned PANI-CNT layer gave a receiver element with a base film, surface treatment, and patterned PANI-CNT, dielectric, silver and PANI-CNT layers in layered sequence. Post-processing steps improved line-edge quality.

A. Preparation of Multilayer PANI-CNT—Ag Nanoparticle—Dielectric Donor Substrate (a) Preparation and coating of polyaniline layer. Procedure was identical to that described above in Example 6-A-a.

(b) Preparation and coating of silver layer. The components of the silver formulation and dispersion are described in entry 3 of Table 6 above. The dispersion (5 mL) was coated onto the PANI-CNT layer on the 40% T Cr PET donor substrate (~90 by 52 cm) using a CV coater at 5.8 ft/min with a CN#7 formed Buschman rod and dried at 49° C. for 20 minutes.

(c) Preparation and coating of dielectric layer. General aqueous dielectric layer formulation procedure was followed using 16.76 g of Joncryl® 63 (30 wt %), 16.78 g of Joncryl® 95 (30 wt %), 0.21 g of SDA 2860, 0.50 g of Byk® 348 (10 wt % in water), and 23.26 g of water to give a formulation with a pH of 8.51. The resulting solution (3 mL) was coated onto the silver nanoparticle layer with a CN#2 formed Buschman rod at 6.3 ft/min with a CV coater and dried at 45° C. for 6 minutes. The wt % of materials in the dried coating was as follows: 48.7 wt % Joncryl® 63, 48.8 wt % Joncryl® 95, 2.0 wt % SDA 2860, and 0.50 wt % Byk® 348. [Joncryl® 63 is a solution of a water-soluble styrene acrylic resin with a pH of 8.4, MW of 12,000, acid number of 213 and Tg of 73. Joncryl® 95 is an emulsion of an ammonia salt of modified styrene acrylic polymers with a pH of 8.0 and an acid number of 70. Both are from Johnson Polymer.]

B. Preparation of a Thermal Imaging Receiver with a Patterned PANI-CNT Layer (a) Preparation and coating of PANI-CNT donor substrate. Procedure and materials for the dispersion were identical to those of Example 6-A-a except that xylenes was used as the solvent instead of the xylenes/1,2-dichlorobenzene mixture. The amounts of materials utilized were as follows: 0.1230 g of HiPco Raw CNT, 0.063 g of Disperbyk® 163, 29.680 g of xylenes, 5.144 g of PANI-DNNSA [31.68% by wt. in xylenes and 2-butoxyethanol (4:1 ratio) with 0.7 acid doping], and 28.9 micro-L of Triton® X 114 (10 wt % in xylenes). The dispersion (10.9 mL) was coated onto a 40% T Cr PET donor substrate (~90 cm×52 cm) using a CV coater at 5.8 ft/min with CN#10 formed Buschman rod and dried at 45° C. for 20 minutes.

(b) Thermal transfer process for patterning PANI-CNT layer on base film of receiver. A portion of the PANI-CNT donor (~30 cm×20 cm; dried for an additional 60 min at 50° C. five months prior to the thermal transfer experiment) and a thermal imaging Melinex® ST 504 receiver (~28 cm×18 cm) were loaded into the Creo Trendsetter® 800 thermal platesetter according to the general procedure described above. Two rectangular patterns (1.25 cm×0.75 cm), one a solid block of material (herein referred to as the solid-block pattern) and one in which the material was patterned into vertical lines of 120 microns in width with spacing of 240 microns (herein referred to as the vertical-line pattern), were utilized as the patterns in this printing experiment. Two rows (rows 1 and 2) were printed with thirteen alternating solid-block and vertical-line patterns in each line. Printing parameters were as follows: drum speed=160; surface depth=47; surface reflectivity=0.46; escan=0; power=5.75 W (row 1) and 5.45 W (row 2).

C. Thermal Transfer Process for Patterninq PANI-CNT—Ag Nanoparticle—Dielectric Multi-layer.

The PANI-CNT donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=47; surface reflectivity=0.54; escan=0; alternating solid-block and vertical line patterns. Row 1: Multi-layer printed on top of the patterned PANI-CNT layer at drum speed 120 from 7.50 to 10.50 W in 0.25 W increments. Row 2: Multi-layer printed on top of the patterned PANI-CNT layer at drum speed 160 from 9.00 to 12.00 W in 0.25 W increments. Row 3: Multi-layer printed onto the receiver surface at drum speed 160 from 7.50 to 10.50 W in 0.25 W increments.

D. Thermal Transfer Evaluation and Post-processing.

The multilayer transferred to varying extents at all powers with optimal quality and highest degree of transfer observed at 7.5-8.25 W for Row 1, 9.25-10 W for Row 2, and 8-8.25 W for Row 3. In all three rows, material in non-exposed regions between the printed lines was transferred along with the lines. The material that was transferred between the lines was very loosely adhered to the receiver and to the lines themselves and could be easily and selectively removed by contact with an adhesive surface, leaving the desired line pattern on the receiver. This was exemplified in Row 1 (10.5 W), Row 2 (12.0 W) and Row 3 (10.5 W) using a tacky roller and in Row 3 (10.25 W) using Scotch® tape (1 min contact).

EXAMPLE 8

Black—Ag Nanoparticle—Dielectric Multi-Layer

This example illustrates the process of the invention wherein a thermal imaging substrate was fabricated with a base film; chrome LTHC layer; and black, silver, and dielectric transfer layers in layered sequence. Thermal transfer onto a receiver comprising a surface-treated base film gave a receiver element with a base film, surface treatment, and patterned dielectric, silver and black layers in layered sequence. Thermal transfer onto a receiver comprising a surface-treated base film with a patterned PANI-CNT layer gave a receiver element with a base film, surface treatment and patterned PANI-CNT, dielectric, silver and black layers in layered sequence. Thermal transfer onto a receiver comprising a surface-treated base film with a patterned silver nanoparticle layer gave a receiver element with a base film, surface treatment and patterned silver, dielectric, is silver and black layers in layered sequence. Post-processing steps improved line-edge quality.

A. Preparation of Multilayer Black—Ag Nanoparticle—Dielectric Donor Substrate (a) Preparation and coating of black layer. General aqueous dielectric layer formulation procedure was followed using 12.60 g of Joncryl® 56 (27 wt %), 4.93 g of Latex L-34-1 (30 wt %), 0.025 g of SDA 2860, 0.050 g of Byk® 348, 0.910 g of Carbon Black Acroverse Paste 32B56 (33 wt %; Penn Color), and 11.60 g of water to give a formulation with a pH of 9.20. The resulting solution (3 mL) was coated onto the 40% T Cr Blue PET donor substrate (~90 by 52 cm) using a CV coater with a CN#2 formed Buschman rod at 6.3 ft/min and dried at 45° C. for 6 minutes. The wt % of materials in the dried coating was as follows: 63.0 wt % Joncryl® 56, 30.1 wt % Latex L-34-1, 0.5 wt % SDA 2860, 0.90 wt % Byk® 348, and 5.6 wt % 32B56 Carbon Black. [Joncryl® 56 is a solution of a water-soluble styrene acrylic resin with a pH of 9.1, MW of 4,600, acid number of 108 and Tg of 60 from Johnson Polymer.]

(b) Preparation and coating of silver layer. The components of the silver formulation and dispersion are described in entry 1 in Table 6 above. The dispersion (7 mL) was coated onto the black layer on the 40% T Cr Blue PET donor substrate using a CV coater at 5.8 ft/min with a CN#6 formed Buschman rod and dried at 48° C. for 20 min and later for 60 min at 50° C.

(c) Preparation and coating of dielectric layer. Formulation and coating process were identical to that of Example 7-A-c. The donor was dried for an additional 45 min at 45° C. immediately prior to the thermal transfer experiment.

B. Preparation of a Thermal Imaging Receiver with a Patterned PANI-CNT Layer in Rows 1 and 2 and a Patterned Silver Nanoparticle Layer in Row 3

(a) Preparation and coating of PANI-CNT donor substrate. Formulation and coating were identical to that of Example 7-B-a.

(b) Thermal transfer process for patterning PANI-CNT layer on base film of receiver. Process was identical to that of Example 7-B-b with the following exceptions: surface reflectivity=0.54; power=5.5 W (Rows 1 & 2), fourteen alternating patterns were printed in Row 2.

(c) Preparation and coating of silver nanoparticle donor substrate. The components of the silver formulation and dispersion are described in entry 4 in Table 6 above. The dispersion (8 mL) was coated onto Melinex® 453 donor film (~90 by 52 cm) using a CV coater at 5.8 ft/min with a CN#6 formed Buschman rod and dried at 47° C. for 20 min. The donor was dried for an additional 60 min at 50° C. approximately three weeks prior to the thermal transfer experiment.

(d) Thermal transfer process for patterning silver nanoparticle layer on base film of receiver. The PANI-CNT donor was removed from the drum while leaving the patterned receiver in place on the drum. A portion of the silver nanoparticle donor (~30 cm×20 cm) was loaded into the Creo Trendsetter® 800 thermal platesetter according to the general procedure described above. Fourteen alternating solid-block patterns and vertical-line patterns (1.25×0.75 cm) were printed in Row 3. Printing parameters were as follows: drum speed=40; surface depth=30; surface reflectivity=0.48; escan=0; power=4.8 W.

C. Thermal Transfer Process for Patterning Black—Ag Nanoparticle—Dielectric Multi-layer.

The silver nanoparticle donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=60; surface reflectivity=0.30; escan=0; alternating solid-block and vertical line patterns (1.25×0.75 cm). Row 1: Multi-layer was printed directly on top of the patterned PANI-CNT layer at drum speed 40 from 4.00 to 7.25 W in 0.25 W increments. Row 2: Multi-layer was printed on top of and slightly offset from the patterned PANI-CNT layer at drum speed 100 from 6.00 to 9.25 W in 0.25 W increments. Row 3: Multi-layer was printed on top of the patterned silver nanoparticle layer at drum speed 40 from 3.50 to 7.40 W in 0.30 W increments. Row 4: Multi-layer was printed onto the receiver surface at drum speed 40 from 3.50 to 7.40 W in 0.30 W increments.

D. Thermal Transfer Evaluation and Post-processing.

Complete transfer of the multilayer was observed at 4.5 W for Row 1, at 3.75-4.75 W for Row 3 and at 3.5-4.5 W for Row 4. For Row 2, the offset multilayer transferred to varying extents at the different powers onto both the patterned PANI-CNT layer and onto the receiver. In all four rows, some material in non-exposed regions between the printed lines was transferred along with the lines. For Rows 3 and 4, the material that was transferred between the lines could be easily and selectively removed by contact with an adhesive surface, leaving the desired line pattern on the receiver. This was exemplified in Row 3 (4.75 W) and Row 4 (3.75 W) with Scotch® tape (30-60 sec contact).

EXAMPLE 9

Black—Dielectric—Ag Nanoparticle Multi-Layer

This example illustrates the process of the invention wherein a thermal imaging substrate was fabricated with a base film; organic LTHC layer; and black, dielectric and silver transfer layers in layered sequence. Thermal transfer onto a receiver comprising a surface-treated base film gave a receiver element with a base film, surface treatment, and patterned silver, dielectric, and black-dielectric layers in layered sequence. Thermal transfer onto a receiver comprising a surface-treated base film with a patterned dielectric layer gave a receiver element with a base film, surface treatment, and patterned dielectric, silver, dielectric, and black layers in layered sequence.

A. Preparation of Multilayer Black—Dielectric—Ag Nanoparticle Multi-layer Donor Substrate (a) Preparation and coating of black layer. General aqueous dielectric layer formulation procedure was followed using 11.10 g of Joncryl® 56 (27 wt %), 0.135 g of ammonium hydroxide (3 wt % in water), 0.060 g of SDA 2860, 0.20 g of Byk® 348 (10 wt % in water), 3.110 g of Carbon Black Acroverse Paste 32B56 (33 wt %; Penn Color), and 8.28 g of water to give a formulation with a pH of 9.34. The resulting solution (3 mL) was coated onto an Organic LTHC Green PET donor substrate (~90 by 52 cm) using a CV coater with a CN#2 formed Buschman rod at 6.3 ft/min and dried at 45° C. for 6 minutes. The wt % of materials in the dried coating was as follows: 73.0 wt % Joncryl® 56, 0.1 wt % Ammonium Hydroxide, 1.5 wt % SDA 2860, 0.50 wt % Byk® 348, and 25.0 wt % 32B56 Carbon Black.

(b) Preparation and coating of dielectric layer. Formulation and coating process were identical to that of Example 7-A-c.

(c) Preparation and coating of silver layer. Formulation and coating process were identical to that of Example 8-A-b.

B. Preparation of a Thermal Imaging Receiver with a Patterned Dielectric Layer in Rows 1, 2, 5 and 6.

(a) Preparation and coating of dielectric donor substrate. General aqueous dielectric layer formulation procedure was followed using 33.32 g of Latex L-56-3 (30 wt %), 12.34 g of Latex L-33-3 (30 wt %), 0.87 g of SDA 2860, 0.165 g of Byk® 345, 4.164 g of 2-butoxyethanol, and 38.85 g of water to give a formulation with a pH of 3.84. The resulting solution (7 mL) was coated onto the Organic LTHC Green PET donor substrate (~90 by 52 cm) with a CN#7 formed Buschman rod with a CV coater at 9.8 ft/min and dried at 45° C. for 6 minutes. The wt % of materials in the dried coating was as follows: 68.3 wt % Latex L-56-3, 25.3 wt % Latex L-33-3, 5.4 wt % SDA 2860, and 1.0 wt % Byk® 345.

(b) Thermal transfer process for patterning dielectric layer on base film of receiver. A portion of the dielectric donor (~30 cm×20 cm) and a thermal imaging Melinex® ST 504 receiver (~28 cm×18 cm) were loaded into the Creo Trendsetter® 800 thermal platesetter according to the general procedure described above. Seventeen solid-block patterns were printed in Rows 1 and 5 and seventeen vertical-line patterns were printed in Rows 2 and 6. Printing parameters were as follows: drum speed=160; surface depth=70; surface reflectivity=0.30; escan=0; power=9.70 W (rows 1 and 5) and 10.30 W (rows 2 and 6). Patterns were 1.9×1.3 cm.

C. Thermal Transfer Process for Patterning Black—Dielectric—Ag Nanoparticle Multi-layer.

The dielectric donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=70; surface reflectivity=0.24; escan=0; drum speed=60. Row 1: The multi-layer was printed in solid-block patterns on top of the patterned dielectric layer from 4.50 to 9.30 W in 0.30 W increments. Row 2: The multi-layer was printed in vertical-line patterns on top of the patterned dielectric layer from 5.20 to 10.00 W in 0.30 W increments. Row 3: The multi-layer was printed in alternating vertical-line and solid-block patterns onto the receiver from 5.20 to 10.80 W in 0.40 W increments. Patterns were 1.9×1.3 cm for Rows 1 and 2 and 1.9×0.8 cm for Row 3.

D. Evaluation of Thermal Transfer of Multi-layer.

Complete transfer of the Ag portion of the multilayer donor was exhibited in exposed regions along with complete transfer of the dielectric and black portions of the multilayer, except at some swath boundaries and coating defects, at 4.5-7.5 W for Row 1, at 5.2-10.0 W for Row 2, and at 5.2-6.7 W for Row 3 with the best line-edge quality for Row 3 observed at 5.2-5.8 W.

EXAMPLE 10

Dielectric—Ag Nanoparticle Bi-Layer

This example illustrates the process of the invention wherein a thermal imaging substrate was fabricated with a base film; chrome LTHC layer; and dielectric and silver transfer layers in layered sequence. Thermal transfer onto a receiver comprising a surface-treated base film gave a receiver element with a base film, surface treatment and patterned silver and dielectric layers in layered sequence. Thermal transfer onto a receiver with a surface-treated base film with a patterned dielectric layer gave a receiver element with a base film, surface treatment and patterned dielectric, silver, and dielectric layers in layered sequence. Selective removal from the receiver of the patterned dielectric layer only of the patterned bi-layer and also of both layers of the patterned bi-layer was achieved in post-processing steps by tuning transfer conditions. These steps illustrate selective removal of a carrier layer and also transfer of a printed pattern from the receiver to another surface.

A. Preparation of Dielectric—Ag Nanoparticle Bi-layer Donor Substrate (a) Preparation and coating of dielectric layer. Formulation was identical to that of Example 9-B-a. The resulting solution (3 mL) was coated onto the 40% T Cr Blue PET donor substrate (~90 by 52 cm) with a CN#2 formed Buschman rod with a CV coater at 9.8 ft/min and dried at 45° C. for 6 minutes.

(b) Preparation and coating of silver layer. Formulation and coating process were identical to that of Example 8-A-b.

B. Preparation of a thermal imaging receiver with a patterned dielectric layer in Rows 1, 2, 5 and 6.

Rows 4, 5 and 6 of the thermal imaging receiver prepared in Example 9, referred to herein as Receiver A, were utilized and are referred to in the present example as Rows A4, A5 and A6. A separate, non-patterned ST504 Melinex® receiver, referred to herein as Receiver B, was also utilized (Rows B1, B2, B3 and B4).

C. Thermal Transfer Process for Patterning Dielectric—Ag Nanoparticle Bi-layer.

The multilayer donor of Example 9 was removed from the drum while leaving the patterned Receiver A in place on the drum. A portion of the dielectric-Ag nanoparticle bi-layer donor of the present example (~30 cm×20 cm) was loaded into the Creo Trendsetter® 800 thermal platesetter according to the general procedure described above. Printing parameters for all rows of both receivers were as follows: surface depth=70; surface reflectivity=0.24; escan=0. Following the printing of rows A4, A5 and A6, the bi-layer donor was peeled off of Receiver A, and Receiver A was then removed from the drum. Next, Receiver B and the bi-layer donor were loaded into the Creo Trendsetter® 800 thermal platesetter according to the general procedure. Rows B1, B2, B3 and B4 were printed. The bi-layer was printed onto a receiver surface in Row A4 (alternating vertical-line and solid-block patterns; 4.50 to 10.10 W in 0.40 W increments; drum speed 60), Row B1 (vertical-line patterns; 6.00 to 10.50 W in 0.25 W increments; drum speed 120), Row B2 (solid-block patterns; 5.00 to 9.50 W in 0.25 W increments; drum speed 120), Row B3 (vertical-line patterns; 8.00 to 12.50 W in 0.25 W increments; drum speed 160), and Row B4 (solid-block patterns; 7.00 to 11.50 W in 0.25 W increments; drum speed 160). The bi-layer was printed onto the patterned dielectric layer in Row A5 (solid block patterns; 4.50 to 9.30 W in 0.30 W increments; drum speed 60) and Row A6 (vertical-line patterns; 5.00 to 9.80 W in 0.30 W increments; drum speed 60). Patterns were 1.9×0.8 cm for Row A4, 1.9×1.3 cm for Rows A5 and A6, and 1.3×1.0 cm for Rows B1, B2, B3 and B4.

D. Thermal Transfer Evaluation and Post-processing.

Bi-layer transferred at all powers with complete and highest quality of transfer observed at 4.5-4.9 W for Row A4; at 4.5 W for Row A5; at 5.3-5.6 W for Row A6 with good line-edge quality; at 6.5 W and above for Row B1 with optimal transfer with straight line edges at 7.25 W; at 8.25 W and above for Row B2; at 8.75-9 W and at 12-12.5 W for Row B3; and at 10.25 W and above for Row B4. Contact with an adhesive surface (Scotch® tape, 30 sec) selectively removed the dielectric layer only of the bi-layer, leaving the Ag lines on the receiver, for the vertical line pattern of 7.7 W of Row A4. Contact with an adhesive surface (Scotch® tape, 60 sec) selectively removed both layers of the bi-layer from the receiver and transferred the pattern to the surface of the tape for the 8.25 W patterns of Row B2 (greater than 90% removal) and Row B4 (greater than 95% removal).

What is claimed is:

1. A process for thermal transfer patterning of nanoparticles comprising the steps of:
   a) providing a thermal imaging donor comprising, in layered sequence: a base film, a carrier layer selected from the group consisting of: a dielectric layer and a conducting layer, and a nanoparticle layer comprising a plurality of nanoparticles characterized by an average longest dimension of about 5 nm to about 1500 nm, wherein said nanoparticle layer comprises a nanoparticle fraction at a loading of at least 98 wt % based on the weight of the nanoparticle layer, and optionally, a dispersant;
      wherein, if the carrier layer is the dielectric layer, the base film comprises a first light attenuating agent and has an OD of 0.1 or greater at a wavelength of about 350 to about 1500 nm;
   b) contacting the thermal imaging donor with a thermal imaging receiver, wherein the thermal imaging receiver comprises a base film; and
   c) transferring at least a portion of the nanoparticle layer and a corresponding proximate portion of the carrier layer together onto the thermal imaging receiver by thermal transfer to provide, in layered sequence on said receiver, a patterned nanoparticle layer and a patterned carrier layer;

wherein said thermal imaging donor is made by a process comprising providing a fluid dispersion consisting essentially of: (1) a non-volatile fraction containing a nanoparticle fraction at a loading of at least 98 wt % based on the weight of the non-volatile fraction, and optionally, a dispersant; and (2) a volatile carrier fluid; providing a thermal imaging substrate comprising the base film and the carrier layer; and applying said fluid dispersion onto the carrier layer and volatilizing the carrier fluid to provide said thermal imaging donor.

2. The process for thermal transfer patterning of claim 1, wherein the thermal transfer is achieved through a laser mediated transfer and said laser has an operating wavelength of about 350 to 1500 nm.

3. The process for thermal transfer patterning of claim 1 wherein said carrier layer is the dielectric layer comprising one or more (co)polymers or (co)oligomers selected from the group consisting of: acrylic and styrenic polymers selected from the group consisting of: acrylic latex, styrenic-acrylic latex, solution-based acrylic polymers, styrenic-acrylic polymers, and combinations thereof; heteroatom-substituted styrenic polymers selected from the group consisting of: poly(4-vinyl)pyridine, poly(4-hydroxy)styrene, partially hydrogenated poly(4-hydroxy)styrene, and copolymers thereof; phenol-aldehyde (co)polymers and (co)oligomers and combinations thereof; ethylene (co)polymer and (co) oligomers comprising ethylene and one or more monomers selected from the group consisting of: norbornene, alkyl (meth)acrylate(s) wherein the alkyl group is a C1 to C18 straight or branched chain alkyl group, (meth)acrylic acid(s), carbon monoxide, and vinyl acetate; and vinyl (co)polymer(s) or (co)oligomer(s) comprising repeat units selected from the group consisting of: vinyl acetate, vinyl chloride, vinylbutyraldehyde, vinyl alcohol and vinylpyrrolidone.

4. The process for thermal transfer patterning of claim 3 wherein said dielectric layer comprises a polymer selected from the group consisting of: phenol-aldehyde (co)polymers/ (co)oligomers and combinations thereof; and one or more latex resins comprising at least about 85 wt % of monomers selected from the group consisting of: alkyl (meth)acrylate wherein the alkyl group is a C1 to C18 straight or branched chain alkyl group, styrene, and alkyl-substituted styrene wherein the alkyl group is a C1 to C18 straight or branched chain alkyl group.

5. The process for thermal transfer patterning of claim 2 wherein the thermal imaging donor further comprises a LTHC layer interposed between the base film and the carrier layer, and the LTHC layer comprises one or more radiation absorbers, wherein the radiation absorber(s) is one or more water-soluble or water-dispersible cyanine compounds selected from the group consisting of: indocyanines, phthalocyanines, and merocyanines; and the LTHC layer further comprises one or more water-soluble or water-dispersible polymeric binders selected from the group consisting of: acrylic resins, hydrophilic polyesters, sulphonated polyesters and maleic anhydride homopolymers and copolymers.

6. The process for thermal transfer patterning of claim 2 wherein the thermal imaging donor further comprises a LTHC layer interposed between the base film and the carrier layer, and wherein the LTHC layer has a transmittance of about 20% to about 80% at the operating wavelength of the laser used in the thermal transfer and comprises one or more radiation absorbers selected from the group consisting of: metal films selected from Cr and Ni; carbon black; graphite; and near infrared dyes with an absorption maxima in the range of about 600 to 1200 nm within the LTHC layer.

7. The process for thermal transfer patterning of claim 1 wherein the nanoparticle fraction is selected from the group consisting of: conducting nanoparticles selected from the group consisting of: gold, silver, copper, and alloys thereof; ITO, ATO, and carbon nanotubes; dielectric nanoparticles selected from the group consisting of: barium titanate, strontium titanate, barium strontium titanate, silicon dioxide, aluminum oxide, and titanium dioxide; and semiconductor nanoparticles selected from the group consisting of: silicon, germanium, III-V semiconductor compounds, and II-VI semiconductor compounds.

8. The process for thermal transfer patterning of claim 1 wherein the thermal imaging donor and receiver base films independently comprise a polymeric material selected from the group consisting of: polyethylene terephthalate, polyethylene naphthalate, triacetyl cellulose and polyimide.

9. The process for thermal transfer patterning of claim 1, wherein the thermal imaging donor base film comprises a light-attenuating agent and has an OD of greater than 0.1 at a wavelength of about 400 to about 750 nm; and wherein the carrier layer is the dielectric layer and further comprises a second light attenuating agent that is a light absorbing compound; and said carrier layer has an OD of about 0.2 or greater at a wavelength of about 750 nm to about 1200 nm.

10. The process for thermal transfer patterning of claim 1 wherein the thermal imaging donor further comprises one or more additional transfer layer(s) selected from the group consisting of: semiconductor layers, conductor layers, and dielectric layers; on top of the nanoparticle layer, and said transferring further comprises transferring a corresponding proximate portion of said additional transfer layer(s) to provide, in layered sequence on said receiver, the patterned additional transfer layer(s), the patterned nanoparticle layer and the patterned carrier layer.

11. The process for thermal transfer patterning of claim 1 wherein said carrier layer comprises two or more transfer layer(s) selected from the group consisting of: conductor layers and dielectric layers; and said transferring comprises transferring a corresponding proximate portion of the two or more transfer layer(s) to provide in layered sequence, said receiver, the patterned nanoparticle layer and the patterned carrier layer comprising two or more transfer layer(s).

12. The process for thermal transfer patterning of claim 1, further comprising removing said patterned carrier layer from the thermal imaging receiver to provide the patterned nanoparticle layer substantially intact and adhered to the receiver.

13. The process for thermal transfer patterning of claim 12 wherein removing the patterned carrier layer comprises one or more step(s) selected from the group consisting of: blowing, peeling, vacuuming and adhesive removal by contacting the patterned carrier layer with a tacky or electrostatic surface.

14. The process for thermal transfer patterning of claim 10 further comprising removing said patterned carrier layer from the thermal imaging receiver to provide, in layered sequence on said receiver, said patterned additional transfer layer(s) and the patterned nanoparticle layer substantially intact and adhered to the receiver.

15. The process for thermal transfer patterning of claim 3 wherein the carrier layer is the dielectric layer and further comprises one or more light absorbing compound(s) selected from the group consisting of: near infrared dyes with an absorption maxima in the range of about 600 to 1200 nm within the dielectric layer; and carbon black.

16. The process for thermal transfer patterning of claim 15 wherein the one or more light absorbing compound(s) is selected from the group consisting of: 3H-indolium, 2-[2-[2-chloro-3-[(1,3-dihydro-1,3,3-trimethyl-2H-indo-2-ylidene)ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1]; and formula (I) and (II) and resonance structures thereof:

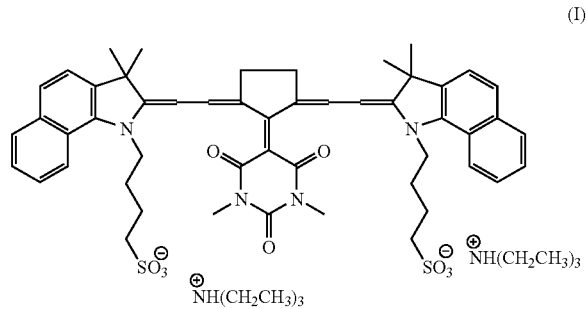

(I)

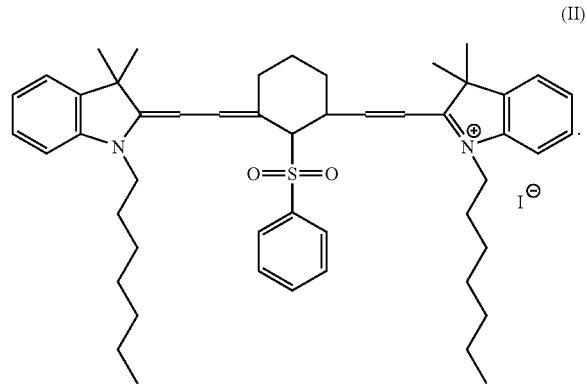

(II)

17. The process for thermal transfer patterning of claim 1 further comprising transferring said patterned nanoparticle layer and patterned carrier layer from said thermal imaging receiver to a second receiver sheet.

18. A multilayer thermal imaging donor comprising, in layered sequence:
   a) a base film;
   b) a carrier layer selected from the group consisting of: a dielectric layer and a conducting layer; and
   c) a nanoparticle layer comprising a nanoparticle fraction comprising a plurality of nanoparticles characterized by an average longest dimension of about 5 nm to about 1500 nm, wherein said nanoparticle layer comprises a nanoparticle fraction at a loading of at least 98 wt % based on the weight of the nanoparticle layer and, optionally, a dispersant;
   wherein, if the carrier layer is the dielectric layer, the base film comprises a first light attenuating agent and has an OD of 0.1 or greater at a wavelength of about 350 to about 1500 nm.

19. The donor of claim 18 wherein the carrier layer is the dielectric layer and further comprises a second light attenuating agent that is a light absorbing compound; and the carrier layer has an OD of about 0.2 or greater at a wavelength in the range of about 350 nm to about 1500 nm.

20. The donor of claim 19, wherein the first light attenuating agent and second light attenuating agent have absorption maxima such that within the base film and carrier layer the absorption maxima of the light attenuating agents differ by at least 50 nm.

21. The donor of claim 19 wherein said base film has an OD of 0.1 or greater at a wavelength of about 400 to about 750 nm; and said carrier layer has an OD of about 0.2 or greater at a wavelength of about 750 nm to about 1200 nm.

22. The donor of claim 18, wherein the carrier layer is the dielectric layer and comprises one or more (co)polymers or (co)oligomers selected from the group consisting of: acrylic and styrenic polymers selected from the group consisting of: acrylic latex, styrenic-acrylic latex, solution-based acrylic polymers, styrenic-acrylic polymers; and combinations thereof; heteroatom-substituted styrenic polymers selected from the group consisting of: poly(4-vinyl)pyridine, poly(4-hydroxy)styrene, partially hydrogenated poly(4-hydroxy) styrene, and copolymers thereof; phenol-aldehyde (co)polymers and (co)oligomers and combinations thereof; ethylene (co)polymer and (co)oligomers comprising ethylene and one or more monomers selected from the group consisting of: norbornene, alkyl (meth)acrylate(s) wherein the alkyl group is a C1 to C18 straight or branched chain alkyl group, (meth)acrylic acid(s), carbon monoxide, and vinyl acetate; and vinyl (co)polymer(s) or (co)oligomer(s) comprising repeat units selected from the group consisting of: vinyl acetate, vinyl chloride, vinylbutyraldehyde, vinyl alcohol and vinylpyrrolidone.

23. The donor of claim 18, wherein the carrier layer is the dielectric layer comprising a polymer selected from the group consisting of: phenol-aldehyde (co)polymers/(co)oligomers and combinations thereof; and one or more latex resins comprising at least about 85 wt % of monomers selected from the group consisting of: alkyl (meth)acrylate wherein the alkyl group is a C1 to C18 straight or branched chain alkyl group, styrene, and alkyl-substituted styrene wherein the alkyl group is a C1 to C18 straight or branched chain alkyl group.

24. The donor of claim 18 wherein the carrier layer is the dielectric layer and comprises latex particles and low molecular weight water-soluble polymers selected from the group consisting of: acrylic and styrenic-acrylic latexes; and water-soluble acrylic and styrenic-acrylic (co)polymers.

25. The donor of claim 19 wherein the second light attenuating agent is selected from the group consisting of: one or more near infrared dyes with an absorption maxima in the range of about 600 to 1200 nm within the dielectric layer; and carbon black.

26. The donor of claim 19 wherein the second light attenuating agent is an indolenine dye with an extinction coefficient of 2000 or greater at a wavelength in the range of about 800 nm to about 900 nm; and is present at about 0.5 to about 10 wt % based upon the dry weight of the carrier layer.

27. The donor of claim 19 wherein the second light attenuating agent is selected from the group consisting of: 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1]; and formula (I) and (II) and resonance structures thereof:

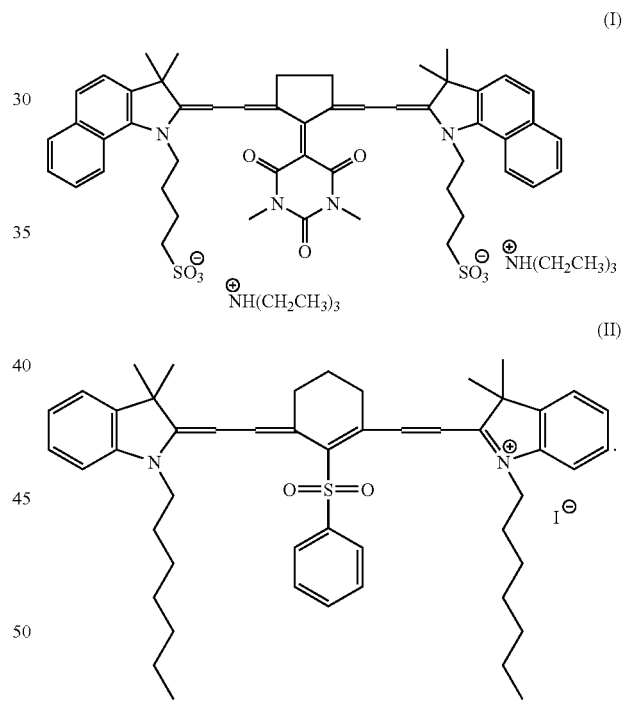

28. The donor of claim 18, further comprising a LTHC layer interposed between the base film and the carrier layer wherein the LTHC layer comprises one or more radiation absorbers selected from the group consisting of: metal films selected from Cr and Ni; carbon black; graphite; and near infrared dyes with an absorption maxima in the range of about 600 to 1200 nm within the LTHC layer.

29. The donor of claim 28, wherein the one or more radiation absorbers is one or more water-soluble or water-dispersible cyanine compounds selected from the group consisting of: indocyanines, phthalocyanines, and merocyanines; and the LTHC layer further comprises one or more water-soluble or water-dispersible polymeric binders selected from the group consisting of: acrylic resins, hydrophilic polyesters, sulphonated polyesters and maleic anhydride homopolymers and copolymers.

30. The donor of claim 18, wherein the nanoparticle fraction is selected from the group consisting of: conducting nanoparticles selected from the group consisting of: gold, silver, copper, and alloys thereof; ITO, ATO, and carbon nanotubes; dielectric nanoparticles selected from the group consisting of: barium titanate, strontium titanate, barium strontium titanate, silicon dioxide, aluminum oxide, and titanium dioxide; and semiconductor nanoparticles selected from the group consisting of: silicon, germanium, III-V semiconductor compounds, and II-VI semiconductor compounds.

31. The donor of claim 18, wherein the dispersant comprises one or more resins selected from the group consisting of: a conducting polymer selected from the group consisting of: polyaniline, polythiophene, polypyrrole and derivatives thereof; semiconducting polymers selected from the group consisting of: polyacene, polyphenylene, poly(phenylene vinylene), polyfluorene, poly(3,4-bisubstituted thiophene), polybenzothiophene, polyisothianapthene, polypyrrole, polyfuran, polypyridine, poly-1,3,4-oxadiazoles, polyisothianaphthene, polyazulene, polyselenophene, polybenzofuran, polyindole, polypyridazines, polypyrene, polyarylamines, and derivatives thereof; dielectric polymers selected from the group consisting of: phenol-aldehyde (co)polymers/(co)oligomers and combinations thereof; acrylic and styrene-acrylic latexes and solution-based acrylics and styrene-acrylic copolymers and combinations thereof; copolymers of ethylene with one or more monomers selected from the group consisting of: (meth)acrylate(s), vinyl acetate, carbon monoxide and (meth)acrylic acid; polyvinylacetate and its copolymers; polyvinylpyrrolidone and polyvinylpyrrolidone-co-vinyl acetate; and graft copolymers comprising a polymeric backbone and one or more macromonomer side chains attached to the backbone characterized by a weight average molecular weight of about 5,000 to about 100,000 wherein said polymeric backbone consists essentially of polymerized ethylenically unsaturated hydrophobic monomers and up to 20 wt %, based on the weight of the graft copolymer, of polymerized ethylenically unsaturated acid monomers; the side chains are hydrophilic macromonomers consisting essentially of polymerized ethylenically unsaturated monomers and 2 to about 100 wt %, based on the weight of the macromonomer, of polymerized ethylenically unsaturated acid containing monomers characterized by a weight average molecular weight of about 1,000 to about 30,000; and wherein the acid groups of the graft copolymer are neutralized with an inorganic base or an amine.

32. The donor of claim 18, wherein the base film comprises a polymeric material selected from the group consisting of: polyethylene terephthalate, polyethylene naphthalate, triacetyl cellulose and polyimide.

33. The donor of claim 18 wherein the carrier layer comprises more than one layer.

34. The donor of claim 18, wherein the carrier layer is the conducting layer comprising a conducting polymer selected from the group consisting of: polyaniline; polythiophene; polypyrrole; polyheteroaromatic vinylenes; and their derivatives; and has the presence of nitrogen or sulfur atoms in the polymer backbone.

35. The donor of claim 18, wherein the carrier layer is the conducting layer selected from the group consisting of: polyaniline and derivatives thereof; and further comprises 0.1 to 12 wt % single wall carbon nanotubes and an organic protic acid having 1 to 30 carbons, said acid at a molar equivalent amount of about 25% to about 100% of the nitrogen atoms in the polyaniline backbone.

36. A donor of claim 18 further comprising an additional transfer layer on top of said nanoparticle layer.

37. The process for thermal transfer patterning of claim 1 wherein the carrier layer is the conducting layer comprising a conducting polymer selected from the group consisting of: polyaniline; polythiophene; polypyrrole; polyheteroaromatic vinylenes; and their derivatives; and has the presence of nitrogen or sulfur atoms in the polymer backbone.

* * * * *